United States Patent
Jo et al.

(10) Patent No.: US 10,522,783 B2
(45) Date of Patent: Dec. 31, 2019

(54) FLEXIBLE DISPLAY INCLUDING PROTECTIVE COATING LAYER HAVING DIFFERENT THICKNESS IN BEND SECTION

(71) Applicant: LG DISPLAY CO., LTD., Seoul (KR)

(72) Inventors: Heungju Jo, Chungju-si (KR); JeongKweon Park, Paju-si (KR); Chan Park, Gumi-si (KR); SangGul Lee, Seoul (KR); Yongsoo Kim, Chilgok-Gun (KR); Jangcheol Kim, Paju-si (KR); Do-Young Kim, Paju-si (KR); Euijun Lee, Seoul (KR); SangEun Han, Jeonju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 78 days.

(21) Appl. No.: 15/716,039

(22) Filed: Sep. 26, 2017

(65) Prior Publication Data

US 2018/0097199 A1 Apr. 5, 2018

(30) Foreign Application Priority Data

Sep. 30, 2016 (KR) .................. 10-2016-0126671
Sep. 30, 2016 (KR) .................. 10-2016-0126675

(51) Int. Cl.
| | | |
|---|---|---|
| H01L 29/08 | (2006.01) |
| H01L 51/52 | (2006.01) |
| H01L 51/00 | (2006.01) |
| H01L 51/56 | (2006.01) |
| H01L 27/32 | (2006.01) |

(52) U.S. Cl.
CPC ...... *H01L 51/5253* (2013.01); *H01L 27/3276* (2013.01); *H01L 51/0097* (2013.01); *H01L 51/56* (2013.01); *H01L 27/323* (2013.01); *H01L 51/5281* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 2013/0148312 A1* | 6/2013 | Han | ............... | H05K 7/00 361/736 |
| 2015/0131035 A1* | 5/2015 | Chen | ............... | G02B 5/305 349/96 |
| 2016/0329520 A1* | 11/2016 | Namkung | ............... | H01L 51/5253 |
| 2018/0053816 A1* | 2/2018 | Choi | ............... | H01L 27/3276 |

* cited by examiner

*Primary Examiner* — Matthew E. Gordon
(74) *Attorney, Agent, or Firm* — Birch, Stewart, Kolasch & Birch, LLP

(57) ABSTRACT

A flexible display device can include a first portion in which an organic light emitting element is disposed on a first surface; a base layer made of a flexible substrate including a second portion, outside of the first portion, having a bend section bent toward a second surface opposite to the first surface; and a protective coating layer covering at least a part of the second portion, wherein a polarization layer is on the organic light emitting element of the first portion without a barrier film, and wherein the protective coating layer is coated such that a portion adjacent to the polarization layer is thicker than the other portion.

15 Claims, 23 Drawing Sheets

FLEXIBLE DISPLAY INCLUDING PROTECTIVE COATING LAYER HAVING DIFFERENT THICKNESS IN BEND SECTION

CROSS-REFERENCE TO RELATED APPLICATIONS

This application claims the priority of Korean Patent Application No. 10-2016-0126675 filed on Sep. 30, 2016, and Korean Patent Application No. 10-2016-0126671 filed on Sep. 30, 2016, in the Korean Intellectual Property Office, the disclosures of all these applications are incorporated herein by reference.

BACKGROUND

Field

The present disclosure relates to a flexible display.

Description of the Related Art

An image display device which implements various types of information on a screen is a core technology of the information and telecommunication age and is being developed to be thinner, lighter, more portable, and to have higher performance. One example of an image display device is an organic light emitting display device that is configured to display an image by controlling the amount of light emitted from an organic light emitting element.

The organic light emitting element is a self-emitting element that uses a thin light emitting layer between electrodes. A general organic light emitting display device has a structure in which a pixel driving circuit and the organic light emitting element are formed on a substrate, and light emitted from the organic light emitting element passes through the substrate or a barrier layer to display an image.

The organic light emitting display device does not need a separate light source, and thus, it can be implemented as a flexible display. In this case, a flexible material such as plastic or metal foil may be used as a substrate of the organic light emitting display device.

SUMMARY

According to an aspect of the present disclosure, a flexible display device may include a first portion in which an organic light emitting element is disposed on a first surface; a base layer made of a flexible substrate including a second portion, outside of the first portion, having a bend section bent toward a second surface opposite to the first surface; and a protective coating layer covering at least a part of the second portion, wherein a polarization layer is on the organic light emitting element of the first portion without a barrier film, and wherein the protective coating layer is coated such that a portion adjacent to the polarization layer is thicker than the other portion.

According to another embodiment of the present disclosure, a flexible display device may include a first portion in which an organic light emitting element is disposed on a first surface; a base layer made of a flexible substrate including a second portion, outside of the first portion, having a bend section bent toward a second surface opposite to the first surface; and a protective coating layer covering at least a part of the second portion, wherein a polarization layer is on the organic light emitting element of the first portion without a barrier film, and wherein the protective coating layer covers a part of a top surface adjacent to an edge of the polarization layer.

According to another embodiment of the present disclosure, a method of manufacturing a flexible display device may comprise arranging an organic light emitting element on a first portion of a flexible substrate, and stacking an encapsulation layer on the organic light emitting element; stacking a polarization layer on the encapsulation layer without a barrier film; removing a part of an edge of a protective film covering an upper surface of the polarization layer; and applying a protective coating layer to at least a part of the upper surface of the polarization layer exposed by the removing step and at least a portion of a second portion outside of the first portion.

Other detailed matters of the embodiments are included in the detailed description and the drawings.

According to the embodiments of the present disclosure, a structure and a component which reduce damage applied to a bend portion of the flexible display may be provided. More specifically, according to the embodiments of the present disclosure, a coating layer which may uniformly protect a bend allowance section may be provided. Therefore, in the flexible display according to the embodiment of the present disclosure, failures or damage in the bend portion may be reduced and a reliability of the end product may be improved.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
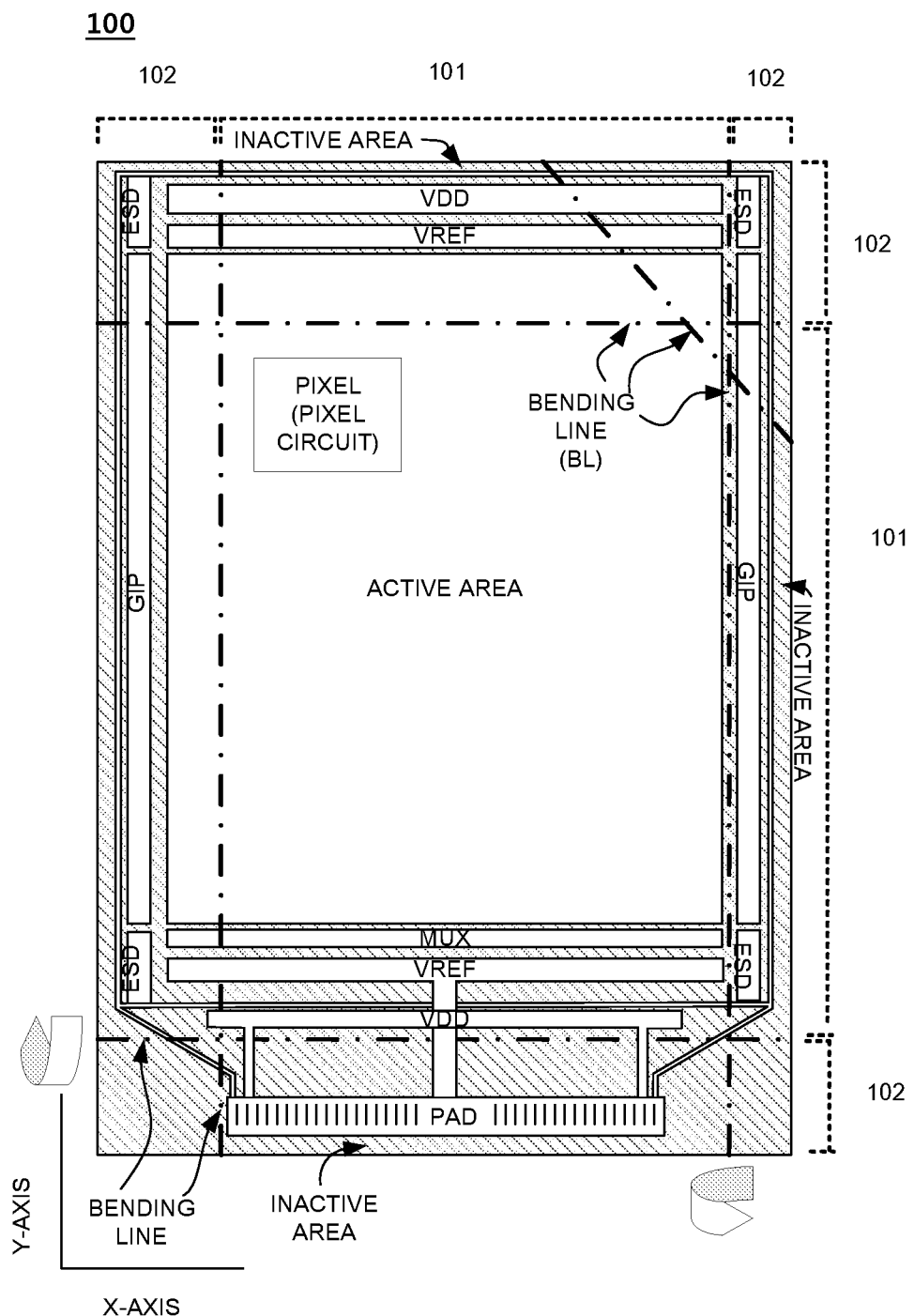
FIG. 1 illustrates a flexible display which may be incorporated in electronic devices, according to an embodiment of the present disclosure.

Advantages and characteristics of the technical features in the present disclosure, and a method of achieving the advantages and characteristics will be clear by referring to the embodiments described below in detail together with the accompanying drawings. However, the present disclosure is not limited to the embodiments disclosed herein but can be implemented in various forms. The embodiments are provided by way of example only so that a person of ordinary skilled in the art can fully understand the content and scope of the present disclosure. As such, the present disclosure can be defined by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may have been omitted to avoid unnecessarily obscuring the subject matter of the present disclosure. The terms such as "including," "having," and "comprising" used herein are generally intended to allow other components to be added unless the terms are used with the term "only". Any references to singular elements may be interpreted to include plural elements unless expressly stated otherwise. Components are interpreted to include an ordinary error range even if not expressly stated.

When the positional relationship between two parts is described using the terms such as "on", "above", "below", and "next", one or more parts may be located between the two parts unless such terms are further limited by "immediately" or "directly". When an element or layer is disposed "on" other element or layer, another layer or another element may be interposed directly on the other element or therebetween. If it is described that a component is "connected" or "coupled" to another component, it is understood that the component may be directly connected or coupled to the other component or another component may be "connected" or "coupled" between the two components.

Although the terms "first", "second", and the like are used for describing various components, these components are not confined by these terms. These terms are merely used for distinguishing one component from the other components.

A size and a thickness of each component illustrated in the drawing are illustrated for convenience of description, and the present disclosure is not limited to the size and the thickness of the component illustrated. Hereinafter, various embodiments of the present disclosure will be described in detail with reference to accompanying drawings.

FIG. 1 illustrates a flexible display which may be incorporated in electronic devices, according to an embodiment of the present disclosure. All the components of the flexible display according to all embodiments of the present disclosure are operatively coupled and configured.

The flexible display refers to a display device provided with flexibility and may also be referred to as a bendable display device, a rollable display device, an unbreakable display device, or a foldable display device. Referring to FIG. 1, a flexible display 100 includes at least one display area (i.e., active area), in which an array of pixels are formed therein. One or more non-display areas (i.e., inactive area) may be provided at the periphery of the active area. That is, the inactive area may be adjacent to one or more sides of the active area. In FIG. 1, the inactive area surrounds a rectangular shaped active area. However, it should be appreciated that the shapes of the active area and the shapes and arrangement of the inactive area adjacent to the active area are not particularly limited to flexible display 100 illustrated in FIG. 1. The active area and the inactive area may be in any shape suitable to the design of the electronic device employing the flexible display 100. Non-limiting examples of the active area shapes in the flexible display 100 include a pentagonal shape, a hexagonal shape, a circular shape, an oval shape, and more.

Each pixel in the active area may be associated with a pixel circuit, which includes at least one switching thin-film transistor (TFT) and at least one driving TFT on the backplane of the flexible display 100. Each pixel circuit may be electrically connected to a gate line(s) and a data line(s) to send and receive signals with one or more driving circuits, such as a gate driver and a data driver located in the inactive area of the flexible display 100.

For example, one or more driving circuits may be implemented with TFTs fabricated in the inactive area as depicted in FIG. 1. The driving circuit may be referred to as a gate-in-panel (GIP) due to its implementation in the panel itself. Also, some of the components, such as data driver integrated circuit (IC), may be mounted on a separate printed circuit board and coupled to a connection interface (e.g., pads, bumps, pins, etc.) disposed in the inactive area using a printed circuit film such as flexible printed circuit board (FPCB), chip-on-film (COF), tape-carrier-package (TCP) or any other suitable configurations. The inactive area with the connection interface can be bent back or away so that the printed circuit film (e.g., COF, FPCB and the like) is positioned at the rear side of the flexible display 100.

The flexible display 100 may include various additional components for generating a variety of signals or for otherwise driving the pixels in the active area. Non-limiting examples of the components for driving the pixels include an inverter circuit, a multiplexer, an electrostatic discharge (ESD) circuit and the like. The flexible display 100 may also include components associated with functionalities other than for driving the pixels of the flexible display 100. For instance, the flexible display 100 may include components for providing a touch sensing functionality, a user authentication functionality (e.g., fingerprint scanning), a multi-level pressure (or force) sensing functionality, a tactile (or haptic) feedback functionality and/or various other functionalities for the electronic device employing the flexible display 100. Some of the aforementioned components can be placed in the inactive area of the flexible display 100 and/or on a separate printed circuit that is connected to the connection interface of the flexible display 100.

Multiple parts of the flexible display 100 can be bent along the (imaginary) bending line BL. The bending line BL in the flexible display 100 may extend horizontally (e.g., along the X-axis shown in FIG. 1), vertically (e.g., along the Y-axis shown in FIG. 1) or even diagonally. Accordingly, the flexible display 100 can be bent in any combination of horizontal, vertical and/or diagonal directions based on the desired design of the flexible display 100.

One or more edges of the flexible display 100 can be bent back or away from the plane of the central portion 101 along the bending line BL. Although the bending line BL is depicted as being located near the edges of the flexible display 100, it should be noted that the bending lines BL can extend across the central portion 101 or extend diagonally at one or more corners of the flexible display 100. Such configurations would allow the flexible display 100 to provide a foldable display or a double-sided display having display pixels on both outer sides of a folded display.

With the ability to bend one or more portions of the flexible display 100, parts of the flexible display 100 may be defined as a substantially flat portion and a bend portion. A part of the flexible display 100 may remain substantially flat and referred to as a central portion 101 of the flexible display 100. Another part of the flexible display 100 may be bent in a certain bend angle from the plane of an adjacent portion, and such portion is referred to as a bend portion 102 of the flexible display 100. The bend portion 102 includes a bend allowance section, which can be actively curved in a certain bend radius.

Figure 2:
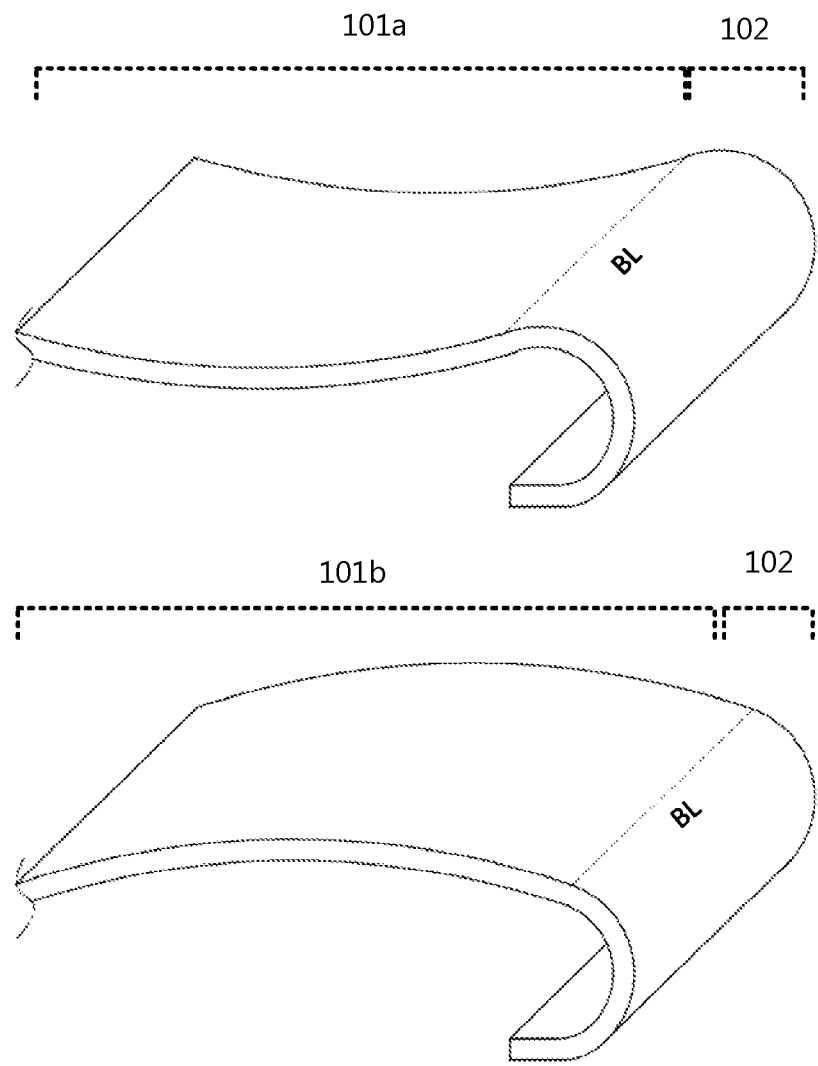
FIG. 2 illustrates an arrangement of a flat portion and a bend portion, according to an embodiment of the present disclosure.

It should be understood that the term "substantially flat" includes a portion that may not be perfectly flat. For example, the concave central portion 101a and the convex central portion 101b depicted in FIG. 2 may be described as a substantially flat portion in some embodiments discussed in the present disclosure. In FIG. 2, one or more bend portions 102 exist next to the concave central portion 101a or convex central portion 101b, and bent inwardly or outwardly along the bending line BL in a bend angle about a bend axis. The bend radius of the bend portion 102 is smaller than the bend radius of the central portion (101a, 101b). In other words, the term "substantially flat portion" refers to a portion with a lesser curvature than that of an adjacent bend allowance section of the flexible display 100.

Depending on the location of the bending line BL in the flexible display 100, a portion on one side of the bending line BL may be positioned toward the center of the flexible display 100, whereas the portion on the opposite side of the bending line BL is positioned toward an edge portion of the flexible display 100. The portion toward the center may be referred to as the central portion and the portion toward the edge may be referred to as the edge portion of the flexible display 100. Although this may not always be the case, a central portion of the flexible display 100 can be the substantially flat portion and the edge portion can be the bend portion of the flexible display 100. It should be noted that a substantially flat portion can also be provided in the edge portion of the flexible display 100. Further, in some configurations of the flexible display 100, a bend allowance section may be positioned between two substantially flat portions.

Bending the inactive area reduces or removes the extent of which the inactive area is visible from the front side of the assembled flexible display 100. Part of the inactive area that remains visible from the front side can be covered with a bezel or similar element. The bezel may be formed, for example, from a stand-alone bezel structure that is mounted to the cover layer 114, a housing or other suitable components of the flexible display 100. The inactive area remaining visible from the front side may also be hidden under an opaque masking layer containing so-called black ink material (e.g., a polymer filled with carbon black). Such an opaque masking layer may be provided on a portion of various layers included in the flexible display 100, such as a touch sensor layer, a polarization layer, a cover layer, and other suitable layers.

In some embodiments, the bend portion of the flexible display 100 may include an active area capable of displaying image from the bend portion, which is referred herein after as the second active area. That is, the bending line BL can be positioned in the active area so that at least some display pixels of the active area is included in the bend portion of the flexible display 100. In other words, the active area itself may be bent such that the same or different images (or information) can be displayed on the relatively flat screen portions and/or the bent screen portions.

Figure 3A:
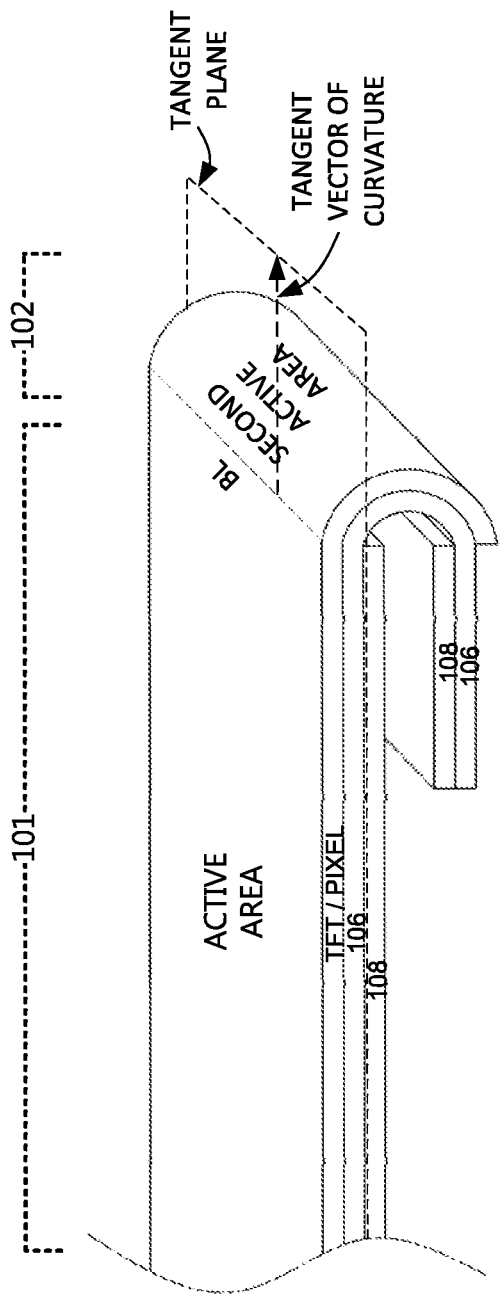
FIGS. 3A and 3B illustrate an arrangement of an active area of a flexible display, according to an embodiment of the present disclosure.
Figure 3B:
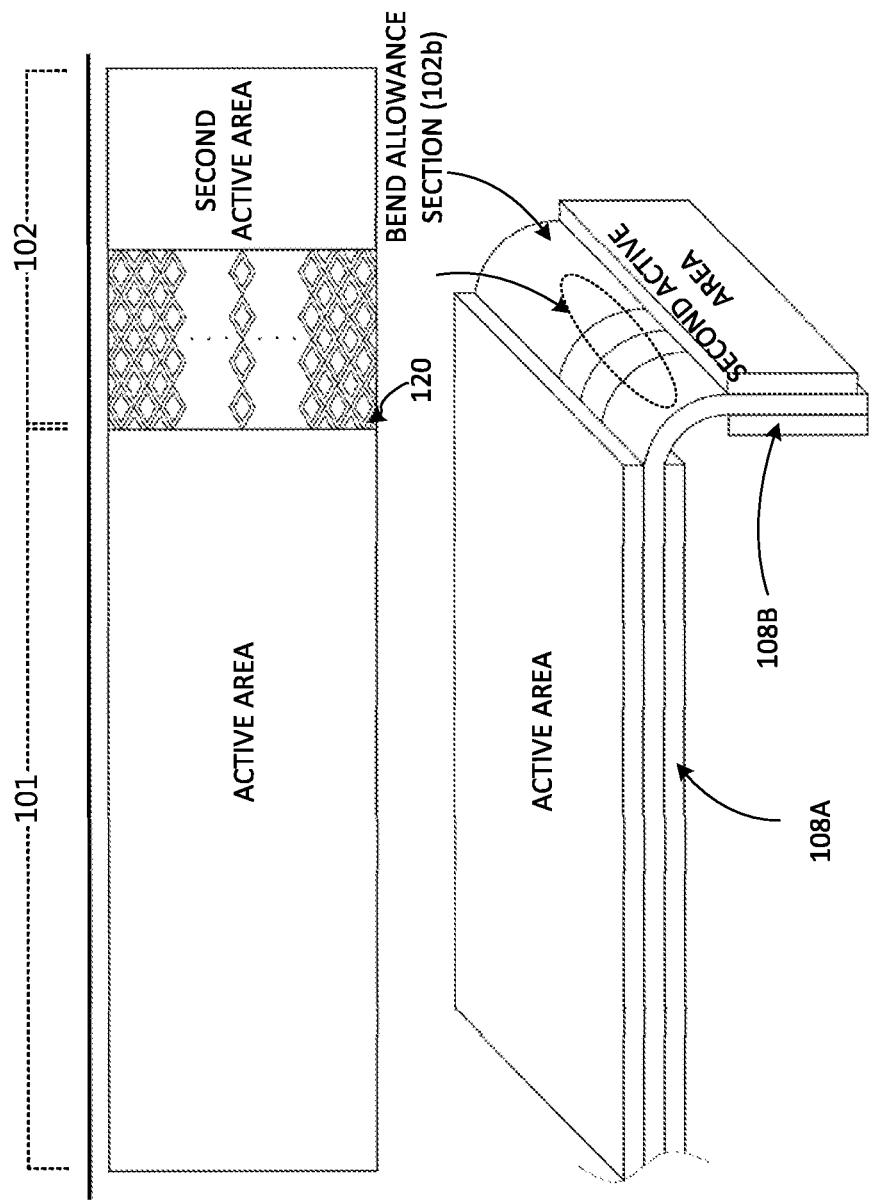

FIGS. 3A and 3B each illustrate an arrangement of active areas in an embodiment of the flexible display 100 of the present disclosure. In the arrangement depicted in FIG. 3A, the matrix of pixels in the second active area of the bend portion may be continuously extended from the matrix of the pixels in the active area of the central portion 101. Alternatively, in the arrangement depicted in FIG. 3B, the second active area within the bend portion 102 and the active area within the central portion 101 of the flexible display 100 may be separated apart from each other by the bend allowance section of the flexible display 100. Some components in the central portion 101 and the bend portion 102 can be electrically connected via one or more conductive lines 120 laid across the bend allowance section of the flexible display 100.

The pixels in the second active area and the pixels in the central active area may be addressed by the driving circuits (e.g., gate driver, data driver, etc.) as if they are in a same matrix. In this case, the pixels of the central active area and the pixels of the second active area may be operated by the same set of driving circuits. By way of example, the Nth row pixels of the central active area and the Nth row pixels of the second active area may be configured to receive the gate signal from the same gate driver. As shown in FIG. 3B, the part of the gate line crossing over the bend allowance section or a bridge for connecting the gate lines of the two active areas may have a strain-reducing design.

Depending on the functionality of the second active area, the pixels of the second active area can be driven discretely from the pixels in the central active area. That is, the pixels of the second active area may be recognized by the display driving circuits as being an independent matrix of pixels separate from the matrix of pixels of the central active area. In such case, the pixels of the second active area may receive signals from at least one discrete driving circuit other than a driving circuit for providing signals to the pixels of the central active area.

Regardless of the shape, the second active area in the bend portion may serve as a secondary active area in the flexible display 100. Also, the size of the second active area is not particularly limited. The size of the second active area may depend on its functionality within the electronic device. For instance, the second active area may be used to provide images and/or text to provide a graphical user interface, icon buttons, text messages, and the like. In some cases, the second active area may be used to provide light of various colors for various purposes (e.g., status indication light), and thus, the size of the second active area need not be as large as the active area in the central portion of the flexible display 100.

Figure 4:
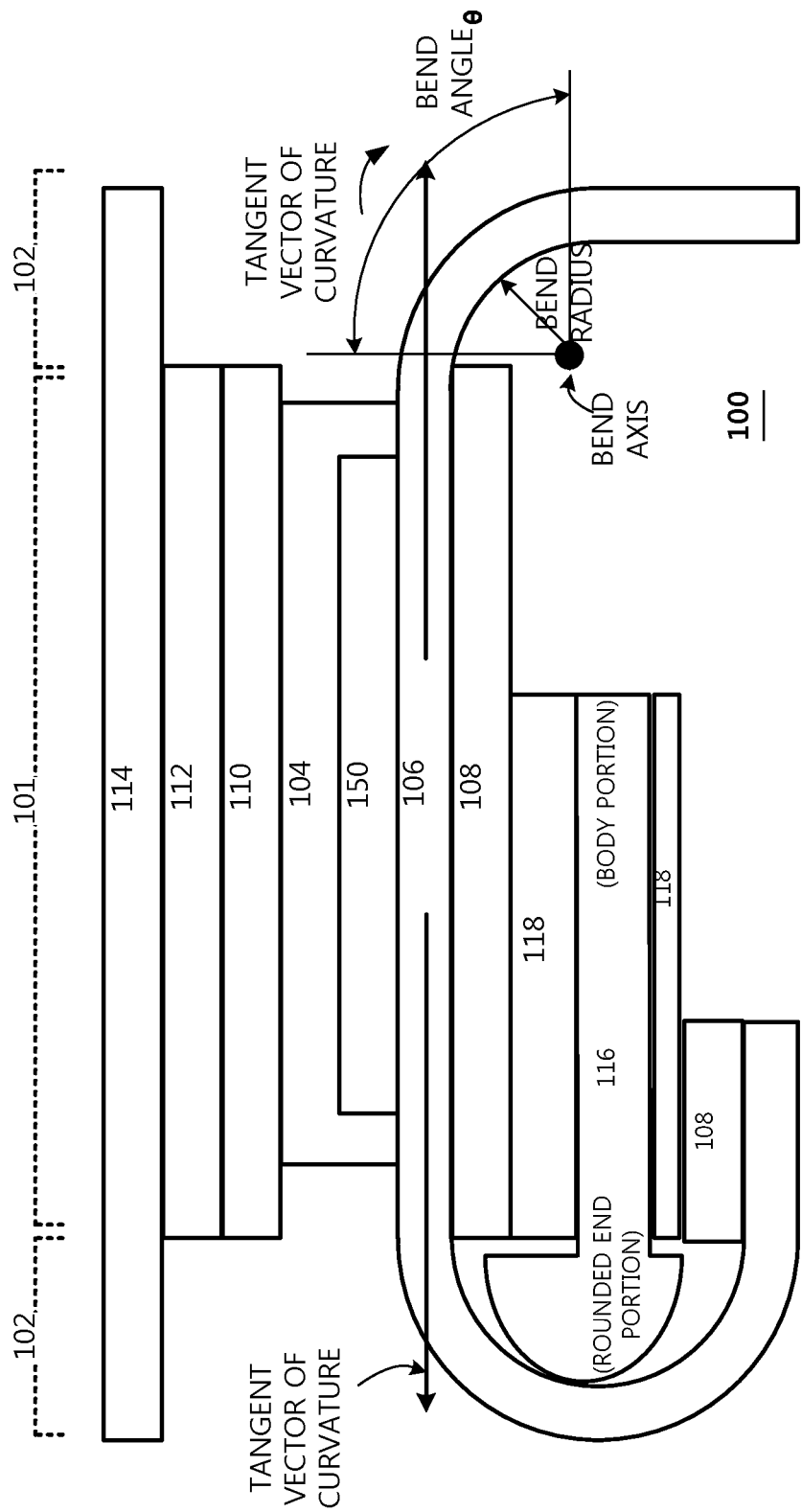
FIG. 4 a cross-sectional view illustrating a simplified stack structure of a flexible display according to an embodiment of the present disclosure.

FIG. 4 illustrates a simplified stack structure of components in a flexible display according to an embodiment of the present disclosure. For convenience of explanation, the central portion 101 of the flexible display 100 is illustrated as being substantially flat, and the bend portions 102 are provided at the edges of the flexible display 100 in FIG. 4.

As shown, one or more bend portions 102 may be bent away from the central portion 101 in a certain bend angle θ and with a bend radius R about the bending axis. The size of each bend portion 102 that is bent away from the central portion need not be the same. That is, the length from the bending line BL to the outer edge of the base layer 106 at each bend portion 102 can be different from other bend portions. Also, the bend angle θ around the bend axis and the bend radius R from the bend axis can vary between the bend portions 102.

In the example shown in FIG. 4, the right side bend portion 102 has the bend angle θ of 90°, and the bend portion 102 includes a substantially flat section. A bend portion 102 can be bent at a larger bend angle θ, such that at least some part of the bend portion comes underneath the plane of the central portion 101 of the flexible display 100 as the bend portion 102 on the left side of the flexible display 100. Also, a bend portion 102 can be bent at a bend angle θ that is less or 90°.

In some embodiments, the radius of curvature (i.e., bend radius) for the bend portions 102 in the flexible display 100 may be between about 0.1 mm to about 10 mm, more specifically between about 0.1 mm to about 5 mm, more specifically between about 0.1 mm to about 1 mm, more specifically between about 0.1 mm to about 0.5 mm. In some embodiments, the bend radius at a bend portion 102 of the flexible display 100 may be less than 0.5 mm.

One or more support layers 108 may be provided at the underside of the base layer 106 to increase rigidity and/or ruggedness at the selective portion of the flexible display 100. For instance, the support layer 108 can be provided on the underside surface of the base layer 106 at the central portions 101 of the flexible display 100. The support layer 108 may not be necessary in the bend allowance section to allow for increased flexibility. The support layer 108 may be provided on the bend portion 102 that is positioned under the central portion 101 of the flexible display 100. Increased rigidity at selective parts of the flexible display 100 may help in increasing the accuracy of the configuration and placement of various components during manufacturing of the flexible display 100. The support layer 108 can also serve to reduce the likelihood of cracks being generated in the base layer 106, if the base layer 106 has a higher modulus than the support layer 108.

The base layer 106 and the support layer 108 may each be made of a thin plastic film formed from polyimide, polyethylene naphthalate (PEN), polyethylene terephthalate (PET), a combination of other suitable polymers, etc. Other suitable materials that may be used to form the base layer 106 and the support layer 108 include, a thin glass, a metal foil shielded with a dielectric material, a multi-layered polymer stack and a polymer composite film comprising a polymer material combined with nanoparticles or microparticles dispersed therein, etc. Support layers 108 provided in various parts of the flexible display 100 need not be made of the same material. For example, a thin-glass layer may be used as a support layer 108 for the central portion 101 of the flexible display 100 while a plastic film is used as a support layer 108 for edge portions.

The thickness of the base layer 106 and the support layer 108 is another factor to consider in designing the flexible display 100. On the one hand, bending of the base layer 106 at a small bend radius can be difficult if the base layer 106 has excessively high thickness. Also, excessive thickness of the base layer 106 can increase mechanical stress to the components disposed thereon during bending the base layer 106. On the other hand, however, the base layer 106 can be too fragile to serve as a substrate for supporting various components of the flexible display if it is too thin.

To ease the bending of the substrate while providing sufficient support, the base layer 106 may have a thickness in a range of about from 5 μm to about 50 μm, more specifically in a range of about 5 μm to about 30 μm, and more specifically in a range of about 5 μm to about 16 μm. The support layer 108 may have a thickness from about 100 μm to about 125 μm, from about 50 μm to about 150 μm, from about 75 μm to 200 μm, less than 150 μm, or more than 100 μm.

In one embodiment, a layer of polyimide with a thickness of about 10 μm to about 16 μm serves as the base layer 106 while a polyethylene terephthalate (PET) layer with a thickness of about 50 μm to about 125 μm serves as the support layer 108. In another embodiment, a layer of polyimide with a thickness of about 10 μm to about 16 μm serves as the base layer 106 while a thin-glass layer with a thickness of about 50 μm to about 200 μm is used as the support layer 108. In yet another suitable configuration, a thin glass layer is used as the base layer 106 with a layer of polyimide serving as the support layer 108 to reduce the likelihood of breaking of the base layer 106.

During manufacturing, some parts of the flexible display 100 may be undesirably exposed to external light. Some materials used in fabricating the components on the base layer 106 or the components themselves may undergo undesirable state changes (e.g., transition of threshold voltage in the TFTs) due to the light exposure during the manufacturing of the flexible display 100. Some parts of the flexible display 100 may be more heavily exposed to the external light than others, and this can lead to display non-uniformity (e.g., mura, shadow defects, etc.). To reduce the impact of such problems, the base layer 106 and/or the support layer 108 may include one or more materials capable of reducing the amount of external light or the affects thereof.

Light blocking material, for instance chloride modified carbon black, may be mixed into the constituent material of the base layer 106 (e.g., polyimide or other polymers). In this way, the base layer 106 may be formed of polyimide with a shade material to provide light blocking functionality. Such a shaded base layer 106 can also improve the visibility of the image content displayed on the flexible display 100 by reducing the reflection of the external light coming in from the front side (i.e., viewing surface) of the flexible display 100.

Instead of the base layer 106, the support layer 108 may include a light blocking material to reduce the amount of light coming in from the rear side (i.e., the side at which the support layer 108 is attached) of the flexible display 100. The constituent material of the support layer 108 may be mixed with one or more light blocking materials in a similar fashion as described above. Furthermore, both the base layer 106 and the support layer 108 can include one or more light blocking materials. Here, the light blocking materials used in the base layer 106 and the support layer 108 need not be the same.

While making the base layer 106 and the support layer 108 to block the unwanted external light may improve display uniformity and reduce reflection as described above, such light blocking function may result in difficulties in recognizing the alignment marks provided on the substrate, which are used for accurate positioning of the components or for carrying out a manufacturing process. For example, accurate positioning of the components on the base layer 106 or the alignment during bending of the flexible display 100 can be difficult as the positioning of the layers may need to be determined by comparing the outer edges of the overlapping portions of the layer(s), instead of relying upon alignment marks which may be difficult to recognize due to the light blocking nature of the base layer 106, support layer 108, etc. Further, checking for unwanted debris or other foreign materials in the flexible display 100 can be problematic if the base layer 106 and/or the support layer 108 blocks an excessive range(s) of light spectrum (i.e., wavelengths in the visible, the ultraviolet, and the infrared spectrum).

Accordingly, in some embodiments, the light blocking material, which may be included in the base layer 106 and/or the support layer 108 is configured to pass the light of certain polarization and/or the light within specific wavelength ranges usable in one or more manufacturing and/or testing processes of the flexible display 100. By way of example, the support layer 108 may pass certain types of light to be used in quality checks and/or alignment processes (e.g., UV, IR spectrum light) during the manufacturing the flexible display 100, but block the light in the visible light wavelength range. The limited range of wavelengths can help reduce the display non-uniformity problem, which may be caused by the shadows generated by the printed circuit film attached to base layer 106, especially if the base layer 106 includes the light blocking material as described above.

The base layer 106 and the support layer 108 can work together in blocking and passing specific types of light. For instance, the support layer 108 can change the polarization of light, such that the light will not be passable through the base layer 106. This way, certain types of light can be passed through the support layer 108 for various purposes during manufacturing of the flexible display 100, but other types of light are unable to pass through the base layer 106 to cause undesired effects to the components disposed on the opposite side of the base layer 106.

The backplane of the flexible display 100 is implemented on the base layer 106. In some embodiments, the backplane of the flexible display 100 can be implemented with thin film transistors (TFTs) using low-temperature poly-silicon (LTPS) semiconductor layer as its active layer. In one example, the pixel circuit and the driving circuits (e.g., GIP: Gate-In-Panel) on the base layer 106 are implemented with NMOS LTPS TFTs. In another example, the backplane of the flexible display 100 can be implemented with a combination of NMOS LTPS TFTs and PMOS LTPS TFTs. For instance, the driving circuit (e.g., GIP) on the base layer 106 may include one or more CMOS circuits to reduce the number of lines for controlling the scan signals on the gate line.

Furthermore, in some embodiments, the flexible display 100 may employ multiple kinds of TFTs to implement the driving circuits in the inactive area and/or the pixel circuits in the active area. For example, a combination of an oxide semiconductor TFT and an LTPS TFT may be used to implement the backplane of the flexible display 100. In the backplane, the type of TFTs may be selected depending to the operating conditions and/or requirements of the TFTs within the corresponding circuit in order to meet the desired technical specifications for the end product that implements the display screen.

Low-temperature-poly-silicon (LTPS) TFTs generally exhibit excellent carrier mobility even at a small profile, making them suitable for implementing integrated driving circuits. The carrier mobility of the LTPS TFT makes it suitable for components having a fast operation speed. Despite the aforementioned advantages, initial threshold voltages may vary among the LTPS TFTs due to the grain boundary of the poly-crystallized silicon semiconductor layer.

A TFT employing an oxide material based semiconductor layer, such as an indium-gallium-zinc-oxide (IGZO) semiconductor layer (referred hereinafter as "the oxide TFT"), is different from the LTPS TFT in many respects. Despite a lower mobility than the LTPS TFT, the oxide TFT is generally more advantageous than the LTPS TFT in terms of power efficiency. Low leakage current of the oxide TFT during its off state allows it to remain in active state longer. This can be advantageous for driving the pixels at a reduced frame rate when a high frame rate for driving the pixels is not needed.

By way of example, the flexible display 100 may be provided with a feature in which the pixels of the entire active area or selective portion of the active area are driven at a reduced frame rate under specific conditions. In this setting, the pixels can be refreshed at a reduced refresh rate depending on the content being displayed via the flexible display 100. Also, the part of the active area displaying still (non-moving) image data (e.g., user interface info, text, etc.) may be refreshed at a lower rate than other parts of the active area used for displaying rapidly changing image data (e.g., movies, animation, etc.). The pixels driven at a reduced refresh rate may have an increased blank period, in which the data signal is not provided to the pixels. This would minimize the power wasted from providing the pixels with the same image data. In such embodiments, some of the TFTs in the pixel circuits and/or the driving circuits of the flexible display 100 can be formed of the oxide TFT to minimize the leakage current during the blank period. By reducing the current leakage from the pixel circuits and/or the driving circuits, the pixels can achieve more stable level of luminance even when the display is refreshed at a reduced rate.

Another feature of the oxide TFT is that it does not suffer from the transistor-to-transistor initial threshold voltage variation issue as much as that of LTPS TFTs. Such a property can be advantageous when increasing the size of the flexible display 100. Threshold shifts under bias stress is also different between LTPS TFTs and oxide TFTs.

Considering the aforementioned characteristics of LTPS TFTs and oxide TFTs, some embodiments of the flexible display 100 disclosed herein can employ a combination of the LTPS TFTs and the oxide TFTs in a single backplane. In particular, some embodiments of the flexible display 100 can employ LTPS TFTs for the driving circuits (e.g., GIP) in the inactive area and employ oxide TFTs for the pixel circuits in the active area. Due to the carrier mobility of the LTPS TFTs, driving circuits implemented with LTPS TFTs may operate at a faster speed than the driving circuits implemented with the oxide TFTs. In addition, more integrated driving circuits can be provided with the LTPS TFTs, which reduces the size of the inactive area in the flexible display 100. With the improved voltage holding ratio of the oxide TFTs used in the pixel circuits, leakage current from the pixels can be reduced. This also enables to drive pixels in a selective portion of the active area or to drive pixels at a reduced frame rate under a predetermined condition (e.g., when displaying still images) while minimizing display defects caused by the leakage current.

In some embodiments, the driving circuits in the inactive area of the flexible display 100 may be implemented with a combination of N-Type LTPS TFTs and P-Type LTPS TFTs while the pixel circuits are implemented with oxide TFTs. For instance, N-Type LTPS TFTs and P-Type LTPS TFTs can be used to implement a CMOS gate driver (e.g., CMOS GIP, Data Driver) whereas oxide TFTs are employed in at least some part of the pixel circuits. Unlike the GIP formed entirely of either the P-type or N-type LTPS TFTs, the gate out signal from the CMOS gate driver can be controlled by DC signals or logic high/low signals. This allows for more stable control of the gate line during the blank period such that the suppression of current leakage from the pixel circuit or unintended activation of the pixels connected the gate line can be achieved.

A CMOS gate driver or an inverter circuit on the backplane can be implemented by using a combination of LTPS TFTs and oxide TFTs. For instance, a P-type LTPS TFT and an N-Type oxide TFT can be used to implement a CMOS circuit. Also, the pixel circuits in the active area can also be implemented by using both the LTPS TFTs and the oxide TFTs. When employing both kinds of TFTs in the pixel circuit and/or the driving circuit, the LTPS TFTs can be strategically placed within the circuit to remove bias remaining in a node between oxide TFTs during their off state and minimize the bias stress (e.g., PBTS, NBTS). In addition, the TFTs in a circuit, which are connected to a storage capacitor, can be formed as oxide TFTs to reduce leakage current therefrom.

The organic light-emitting diode (OLED) element layer 150 is disposed on the base layer 106. The OLED element layer 150 includes a plurality of OLED elements, which is controlled by the pixel circuits and the driving circuits implemented on the base layer 106 as well as any other driving circuits connected to the connection interfaces on the base layer 106. The OLED element layer includes an organic-light emitting material layer, which may emit light of certain spectral color (e.g., red, green, blue). In some embodiments, the organic-light emitting material layer may have a stack configuration to emit white light, which is essentially a combination of multiple colored lights.

The encapsulation 104 is provided to protect the OLED element layer 150 from air and moisture. The encapsulation 104 may include multiple materials of layers for reducing permeation of air and moisture to protect OLED elements thereunder. In some embodiments, the encapsulation 104 may be provided in the form of a thin film.

The flexible display 100 may include a polarization layer 110 for controlling certain display characteristics (e.g., external light reflection, color accuracy, luminance, etc.) of the flexible display 100. Also, the cover layer 114 may be used to protect the flexible display 100.

Electrodes for sensing touch inputs applied from a user may be formed on an interior surface of a cover layer 114 and/or at least one surface of the polarization layer 110. If desired, an independent layer with the touch sensor electrodes and/or other components associated with sensing of touch input (referred hereinafter as touch-sensor layer 112) may be provided in the flexible display 100. The touch sensor electrodes (e.g., touch driving/sensing electrodes) may be formed from transparent conductive material such as indium tin oxide, carbon based materials like graphene or carbon nanotube, a conductive polymer, a hybrid material made of mixture of various conductive and non-conductive materials. Also, metal mesh such as aluminum mesh, silver mesh, etc. can also be used as the touch sensor electrodes.

The touch sensor layer 112 may include one or more deformable dielectric materials. One or more electrodes may be interfaced with or positioned near the touch sensor layer 112 in order to detect or read signals by measuring electrical changes upon deformation of the electrodes. The measurements may be analyzed to assess several levels of the amount of pressure applied on the flexible display 100 during touch operations.

In some embodiments, the touch sensor electrodes can be utilized in identifying the location of the user inputs as well as assessing the pressure of the user input. Identifying the location of touch input and measuring of the pressure of the touch input on the flexible display 100 may be achieved by measuring changes in capacitance from the touch sensor electrodes on one side of the touch sensor layer 112. The touch sensor electrodes and/or other electrode may be used to measure a signal indicative of the pressure on the flexible display 100 by the touch input. Such signals may be obtained simultaneously with the touch signal from the touch sensor electrodes or obtained at a different timing.

The deformable material included in the touch sensor layer 112 may be an electro-active material, in which the amplitude and/or the frequency of the deformable material can be controlled by electrical signals and/or electrical fields. The examples of such deformable materials include piezo-ceramic, electro-active-polymer (EAP) and the like. Accordingly, the touch sensor electrodes and/or separately provided electrodes can activate the deformable material to bend the flexible display 100 in desired directions. In addition, such electro-active materials can be activated to vibrate at desired frequencies, thereby providing tactile and/or texture feedback on the flexible display 100. The flexible display 100 may employ a plurality of electro-active material layers so that bending and vibration of the flexible display 100 can be provided simultaneously or at a different timing. Such a combination can be used in creating sound waves from the flexible display 100 as well.

Some components of the flexible display 100 may make it difficult to bend the flexible display 100 along the bending line BL. Some of the components, such as the support layer 108, the touch sensor layer 112, the polarization layer 110 and the like, may add more rigidity to the flexible display 100. Also, the thickness of such components shifts the neutral plane of the flexible display 100 and thus some of the components may be subjected to greater bending stress than other components.

To facilitate easier bending and to enhance the reliability of the flexible display 100, the configuration of components in the bend portion 102 of the flexible display 100 differs from the central portion 101 of the flexible display 100. Some of the components existing in the central portion 101 may not be disposed in the bend portions 102 of the flexible display 100, or may be provided in a different thickness. The bend portion 102 may be free of at least one among the support layer 108, the polarization layer 110, the touch sensor layer 112, a color filter layer, and/or other components that may hinder bending of the flexible display 100. Such components may not be needed in the bend portion 102 if the bend portion 102 is to be hidden from the view or is otherwise inaccessible to the users of the flexible display 100.

Even if the second or extended active area is provided in the bend portion 102 for providing information to users, the second active area may not require some of these components depending on the usage and/or the type of information provided by the second active area. For example, the polarization layer 110 and/or color filter layer may not be needed in the bend portion 102 when the second active area is used for simply emitting colored light, displaying text or simple graphical user interfaces in a contrast color combination (e.g., black colored text or icons on white background). Also, the bend portion 102 of the flexible display 100 may be free of the touch sensor layer 112 if such functionality is not needed in the bend portion 102. If desired, the bend portion 102 may be provided with a touch sensor layer 112 and/or the layer of electro-active material even though the secondary active area for displaying information is not provided in the bend portion 102.

Since the bend allowance section is most heavily affected by the bending stress, various bending stress-reducing features are applied to the components on the bend portion 102. To this end, some of the elements in the central portion 101 may be absent in at least some part of the bend portion 102. The separation between the components in the central portion 101 and the bend portion 102 may be created by selectively removing the elements at the bend allowance section of the flexible display 100 such that the bend allowance section is free of the respective elements.

Figure 5:
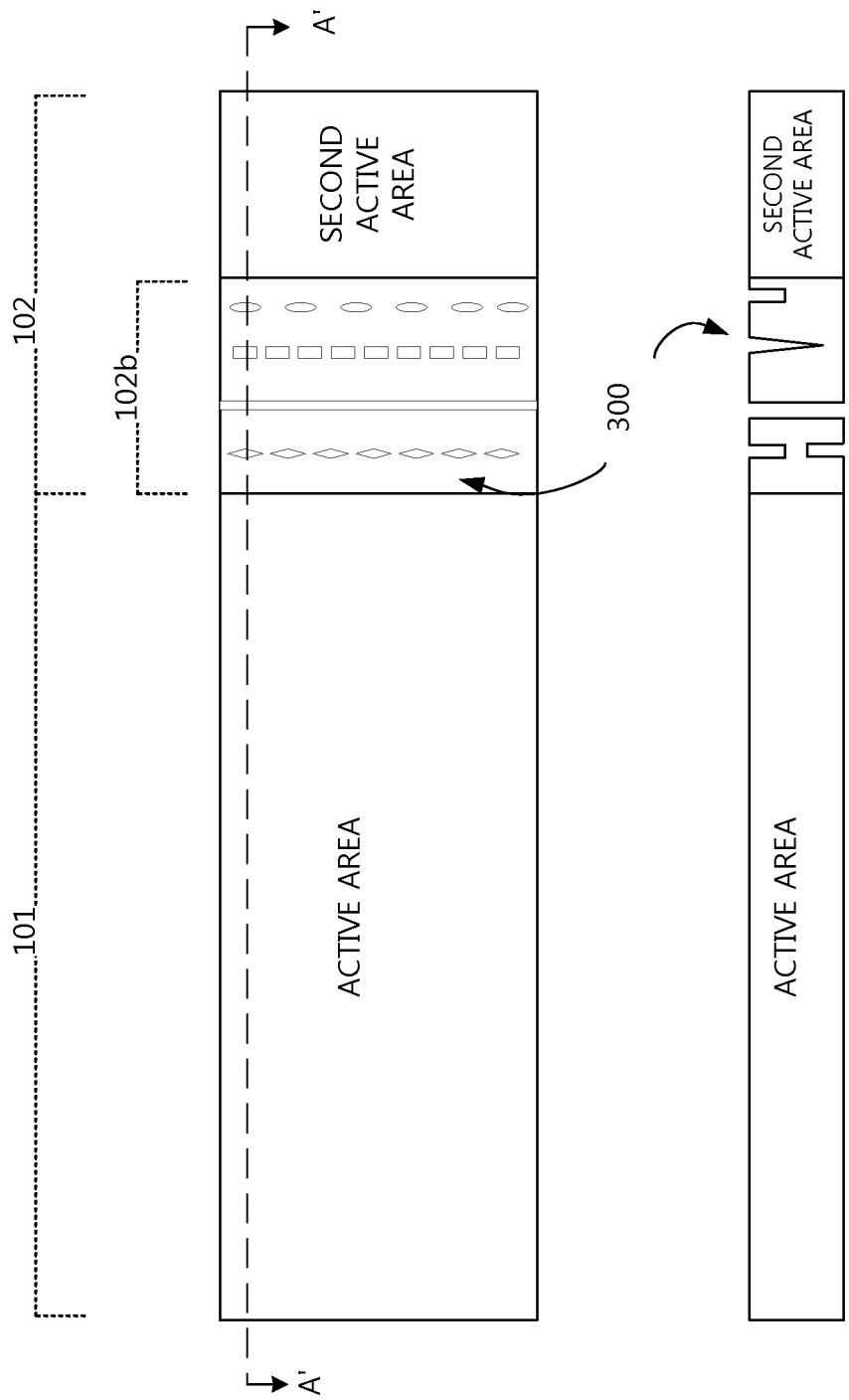
FIG. 5 illustrates a plane view and a cross-sectional view of bending patterns according to an embodiment of the present disclosure.

As depicted in FIGS. 4 and 5, the support layer 108 in the central portion 101 and the support layer 108 in the bend portion 102 can be separated from each other by the absence of the support layer 108 at the bend allowance section 102b. Instead of using the support layer 108 attached to the base layer 106, a support member 116 with an end portion can be positioned at the underside of the base layer 106 at the bend allowance section. Various other components, for example the polarization layer 110 and the touch sensor layer 112 and more, may also be absent from the bend allowance section of the flexible display 100. The removal of the elements may be done by cutting, wet etching, dry etching, scribing and breaking, or other suitable material removal methods. Rather than cutting or otherwise removing an element, separate pieces of the element may be formed at the selective portions (e.g., central portion and the bend portion) to keep the bend allowance section free of such element. Rather than being entirely removed from the bend portion, some elements may be provided with a bending pattern along the bending lines and/or the parts within the bend allowance section to reduce the bending stress.

FIG. 5 illustrates a plane view and a cross-sectional view of bending patterns 300 in accordance with embodiments of the present application. The bending patterns 300 may be applied to some of the components. The bending patterns 300 described above may be used in the support layer 108, the polarization layer 110, the touch sensor layer 112 and various other elements of the flexible display 100.

The flexible display 100 may utilize more than one type of bending pattern 300. It should be appreciated that a number of bending patterns and the types of the bending patterns 300 utilized by the components is not limited. If desired, the depth of the patterns 300 may be sufficient enough to penetrate through the component (or layer) entirely or penetrate only partially through the respective component (or layer). A buffer layer positioned between the base layer 106 and the TFT as well as a passivation layer covering a conductive line may be provided with the bending pattern for reducing bending stress.

Referring back to FIG. 4, the support layer 108 may not be present at the bend allowance section to facilitate bending of the base layer 106. Absent the support layer 108, however, the curvature at the bend allowance section may be easily altered or affected by external force. To support the base layer 106 and maintain the curvature at the bend allowance section, the flexible display 100 may also include a support member 116, which may also be referred to as a "mandrel." The support member 116 depicted in FIG. 4 has a body portion and an end portion. The base layer 106 and the support member 116 are arranged so that that the end portion of the support member 116 is positioned at the underside of the base layer 106 corresponding to the bend allowance section of the flexible display 100.

In embodiments where a bend portion 102 is provided at an edge of the flexible display 100, the support member 116 can be provided at the edge of the flexible display 100. In this setting, a part of the base layer 106 may come around the end portion of the support member 116 and be positioned at the underside the support member 116 as depicted in FIG. 4. Various circuits and components in the inactive area of the flexible display 100, such as drive ICs and interfaces for connecting chip-on-film (COF) and printed circuit board (PCB), may be provided on the base layer 106 that is positioned at the rear side of the flexible display 100. In this way, even the components that are not flexible can be placed under the active area of the flexible display 100.

The support member 116 can be formed of plastic material such as polycarbonate (PC), polyimide (PI), polyethylene naphthalate (PEN), polyethylene terephthalate (PET), etc. The rigidity of the support member 116 formed of such plastic materials may be controlled by the thickness of the support member 116 and/or by providing additives for increasing the rigidity. The support member 116 can be formed in a desired color (e.g., black, white, etc.). Further, the support member 116 may also be formed of glass, ceramic, metal or other rigid materials or combinations of aforementioned materials.

The size and shape of the end portion of the support member 116 can vary depending on the minimum curvature desired at the bend allowance section of the flexible display 100. In some embodiments, the thickness of the end portion and the thickness of the body portion may be substantially the same. In other embodiments, the body portion, which has a planar shape, may be thinner than the end portion of the support member 116. With a thinner profile at the body portion, the support member 116 can support the bend allowance section 102b while avoiding further increasing the thickness in the flexible display 100.

Since the support at the bend allowance section is provided by the end portion of the support member 116, the body portion extended toward the central portion 101 of the flexible display 100 need not be extended into the active area. While the body portion can be extended under the active area for various reasons, the length of the body portion from the end portion towards the opposite end is sufficient so long as the body portion provides enough surface region to secure the support member 116.

To secure the support member 116 in the flexible display 100, an adhesive layer 118 may be provided on the surface of the support member 116. The adhesive layer 118 may include a pressure-sensitive adhesive, a foam-type adhesive, a liquid adhesive, a light-cured adhesive or any other suitable adhesive material. In some embodiments, the adhesive layer 118 can be formed of, or otherwise includes, a compressible material and serve as a cushion for the parts bonded by the adhesive layer 118. As an example, the constituent material of the adhesive layer 118 may be compressible. The adhesive layer 118 may be formed of multiple layers, which includes a cushion layer (e.g., polyolefin foam) interposed between an upper and a lower layers of an adhesive material.

The adhesive layer 118 can be placed on at least one of the upper surface and the lower surface of the body portion of the support member 116. When the bend portion 102 of the flexible display 100 wraps around the end portion of the support member 116, an adhesive layer 118 can be provided on both the lower surface (i.e., the surface facing the rear side) and the upper surface (i.e., the surface facing the front side) of the body portion. An adhesive layer 118 may be provided between the surface of the end portion of the support member 116 and the inner surface of the base layer 106.

During bending, a part of the flexible display 100 on one side of the support member 116 may be pulled toward the support member 116, and the base layer 106 may be damaged by the highest and the lowest edges of the end portion. As such, the heights of the adhesive layer 118 and the support layer 108 between the support member 116 and the base layer 106 may be equal to or greater than the vertical distance between the highest edge of the end portion and the surface of the body portion where the adhesive layer 118 is placed. In other words, the height of the space created by the thickness difference between the end portion and the body portion of the support member 116 may be equal to or less than the collective thickness of the support layer 108 and the adhesive layer 118.

Depending on the shape of the support member 116, a thickness of the adhesive layer 118 on the upper and the lower surfaces of the body portion may be different. For instance, the body portion, which is thinner than the end portion, may not be at the center of the end portion of the support member 116. In such cases, the space on one side of the support member 116 may be greater than the space on the opposite side.

In another example, the lowest edge of the end portion may be provided inside of the bottom surface of the body portion such that the space is provided only on one side of the body portion. In such cases, the adhesive layer 118 on one side of the body portion of the support member 116 can be thicker than the one on the opposite side.

Figure 6A:
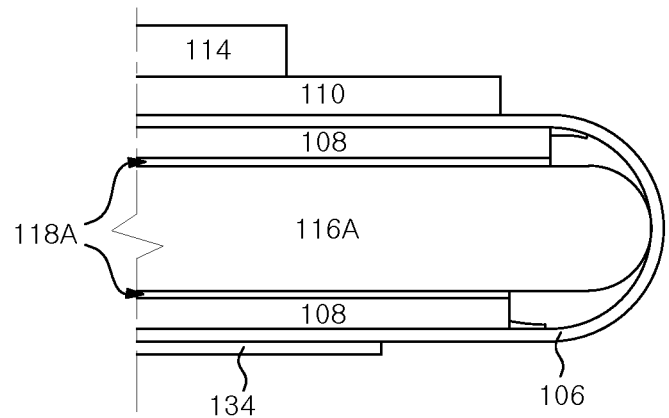
FIGS. 6A to 6C are simplified cross-sectional views illustrating an arrangement of elements in the flexible display according to the present disclosure.
Figure 6B:
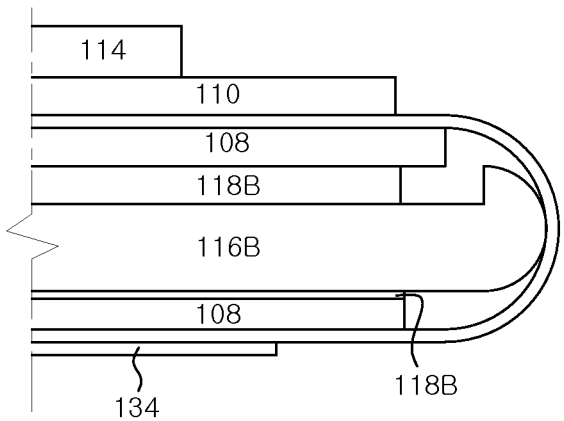
Figure 6C:
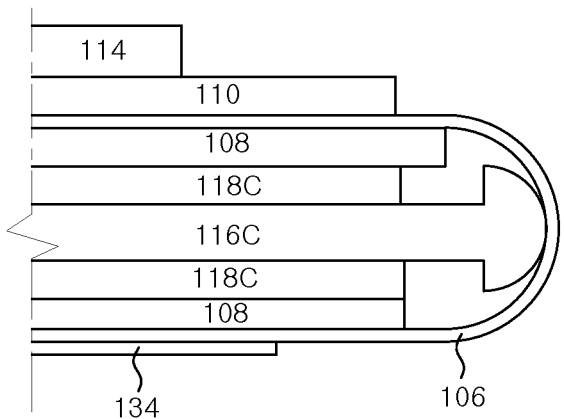

FIGS. 6A, 6B and 6C are simplified cross-sectional views showing an arrangement of elements in various embodiments of the flexible display 100. In one suitable configuration, the thickness of the rounded end portion and the elongated body portion of the support member 116A may be substantially the same as illustrated in FIG. 6A. Such a support member 116A can be formed of the plastic materials. The support member 116A may also be formed of a folded thin sheet metal (e.g., SUS). In this case, the folded edge of the sheet metal can serve as the rounded end portion of the support member 116A. Even when a sheet metal is used to form the support member, the end portion can have greater thickness than the body portion. For instance, pressure can be applied on the part of the folded metal sheet for the body portion to make that portion thinner than the folded edge.

In FIG. 6A, the adhesive layer 118A is illustrated as being applied on the upper, the lower and the surfaces of the rounded end portion of the support member 116A. As the thickness of the support member 116A at the rounded end portion and the body portion is about the same, the thickness of the adhesive layer 118A may have a substantially uniform thickness on the surface of the support member 116A. However, the adhesive layer 118A can be thinner and/or thicker at selective parts of the support member 116A.

In another suitable configuration, the elongated body portion of the support member 116 is thinner than its rounded end portion. In this regard, the bottom surface of the body portion is in-line with the lowest edge of the end portion, providing a support member 116B with a flat bottom as depicted in FIG. 6B. In this configuration, the support members 116B may be formed of one or a combination of aforementioned plastic materials (e.g., polycarbonate, etc.). Also, the adhesive layer 118B provided on the upper surface of the body portion is thicker than the adhesive layer 118B provided on the bottom surface of the body portion of the support member 116B. The adhesive layer 118B on the upper surface of the body portion may include a cushion layer described above while the adhesive layer 118B on the lower surface does not.

In yet another suitable configuration shown in FIG. 6C, neither the top nor the bottom surfaces of the body portion of the support member 116C is in-line with the highest/lowest edges of the rounded portion. The support members 116C may be formed of one or a combination of aforementioned plastic materials (e.g., polycarbonate, etc.). In this example, the body portion is off-centered (i.e., closer to the lowest edge of the rounded portion), and the adhesive layer 118C on the upper surface of the body portion is thicker than the adhesive layer 118C on the lower surface. The adhesive layer 118C on the upper surface of the body portion may include a cushion layer described above while the adhesive layer 118C on the lower surface does not.

In the configurations depicted in FIGS. 6A-6C, the support layer 108 on the upper side of the support member 116 can be extended further out toward the bend allowance section than the encapsulation there above. In other words, a part of the base layer 106 toward the bend allowance section is not covered by the encapsulation, but provided with the support layer 108 thereunder. The extra length of the support layer 108 can help maintain a curvature in the bend allowance section. The edge of the support layer 108 under the support member 116 may be shifted away from the bend allowance section. In some embodiments, the edge of the support layer 108 toward the bend allowance section can be provided with a flange, which extends even further out toward the bend allowance section as shown in FIG. 6A. In one example, the flange may be made by cutting, or otherwise patterning, the support layer 108 to have a tapered edge. In another example, the flange can be provided by stacking at least two support layers with their edges shifted from each other. While omitted in FIGS. 6B and 6C, the flange can be provided in those embodiments as well.

It should be appreciated that the configurations described above in reference to FIGS. 6A-6C are merely illustrative. Adhesive layers having the same thickness can be provided on the upper and the lower surfaces of the support member regardless of the position of the body portion. Further, adhesive layers on the upper surface or the lower surface of the support member can include a cushion layer.

Several conductive lines are included in the flexible display 100 for electrical interconnections between various components therein. The circuits fabricated in the active area and inactive area may transmit various signals via one or more conductive lines to provide a number of functionalities in the flexible display 100. Some conductive lines may be used to provide interconnections between the circuits and/or other components in the central portion and the bend portion of the flexible display 100.

As used herein, the term conductive lines broadly refers to a trace of conductive path for transmitting any type of electrical signals, power and/or voltages from one point to another point in the flexible display 100. As such, conductive lines may include source/drain electrodes of the TFTs as well as the gate lines/data lines used in transmitting signals from some of the display driving circuits (e.g., gate driver, data driver) in the inactive area to the pixel circuits in the active area. Likewise, some conductive lines, such as the touch sensor electrodes, pressure sensor electrodes and/or fingerprint sensor electrodes may provide signals for sensing touch input or recognizing fingerprints on the flexible display 100. Furthermore, conductive lines can provide interconnections between components of the active area in the central portion and components of the second active area in the bend portion of the flexible display 100.

Conductive lines in a flexible display 100 should be carefully designed to meet various electrical and non-electrical requirements. For instance, a conductive line may have a specific minimum electrical resistance level, which may vary depending on the type of signals to be transmitted via the conductive line. Some conductive lines may be routed from the substantially flat portion to the bend portion of the flexible display 100. Such conductive lines should exhibit sufficient flexibility to maintain its mechanical and electrical robustness. Some conductive lines of the flexible display 100 may have a multi-layered structure.

Figure 7A:
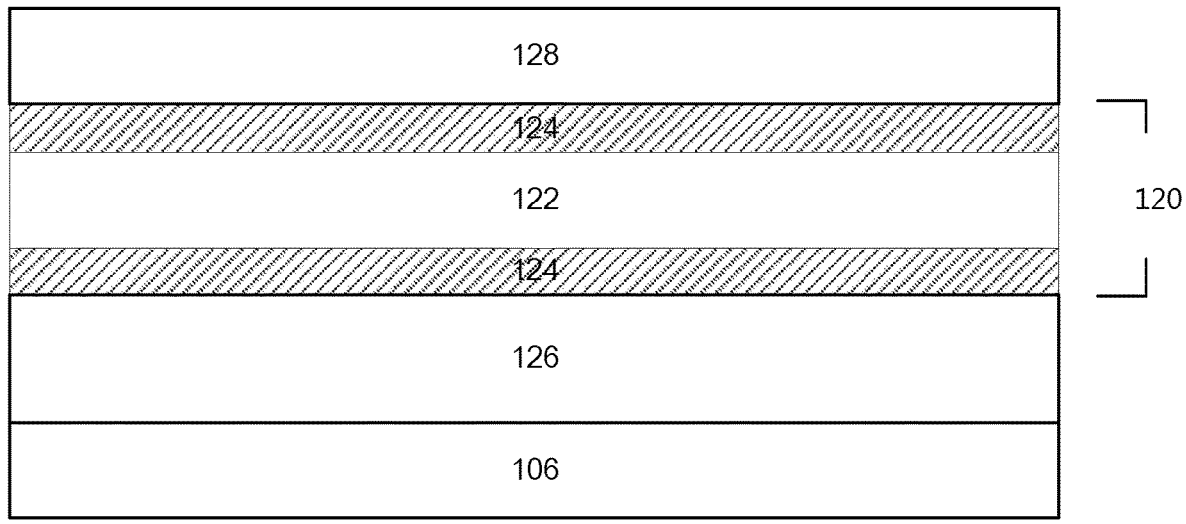
FIGS. 7A and 7B each illustrates a structure of a multi-layered conductive line, according to an embodiment of the present disclosure.
Figure 7B:
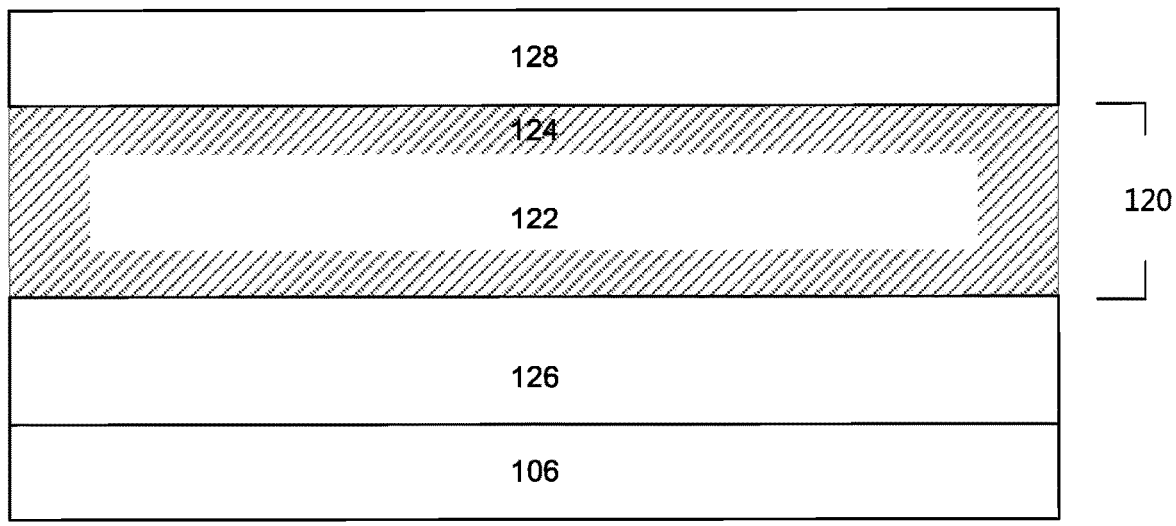

FIGS. 7A and 7B each illustrate a stack structure of the multi-layered conductive line. Referring to FIG. 7A, the conductive line 120 has a multi-layered structure in which the primary conductive layer 122 is sandwiched between the secondary conductive layers 124. The primary conductive layer 122 may be formed of material with a lower electrical resistance than that of the secondary conductive layer 124. Non-limiting examples of the materials for the primary conductive layer 122 include copper, aluminum, transparent conductive oxide, or other flexible conductors.

The secondary conductive layer 124 should be formed of conductive material that exhibits sufficiently low ohmic contact resistance when formed in a stack over the primary conductive layer 122. Low ohmic contact resistance between the conductive layers is not the only factor in the selection of materials for the conductive layers in the multi-layered conductive line 120. While meeting the stringent electrical and thermal requirements (e.g., resistance, heat generation, etc.), the materials of the conductive line 120 should also satisfy the minimum mechanical stress requirement (e.g., Young's modulus). That is, both the primary conductive layer 122 and the secondary conductive layer 124 should be formed of materials exhibiting sufficient flexibility.

Accordingly, in some embodiments, at least some of the conductive lines 120 of the flexible display 100 may be formed with two or more of layers selected from aluminum (Al), titanium (Ti), molybdenum (Mo), and Copper (Cu) layers. Examples of such combination include an aluminum layer sandwiched between titanium layers (Ti/Al/Ti), an aluminum layer sandwiched between upper and lower molybdenum layers (Mo/Al/Mo), a copper layer sandwiched between titanium layers (Ti/Cu/Ti) and a copper layer sandwiched between upper and lower molybdenum layers (Mo/Cu/Mo). Other conductive materials can be used for the primary/secondary conductive layers.

Electronic devices employing the flexible display 100, for instance a wearable electronic device or a water submergible electronic device, may expose the flexible display 100 in a humid environment. In some cases, moisture can reach the conductive line 120. Dissimilar metals and alloys have different electrode potentials, and when two or more come into contact in an electrolyte, one metal acts as anode and the other as cathode. The electro-potential difference between the dissimilar metals accelerates corrosion on the anode member of the galvanic couple, which would be the primary conductive layer 122 in the multi-layered conductive line 120 (e.g., Al layer in the Ti/Al/Ti stack). The anode metal dissolves into the electrolyte, and deposit collects on the cathodic metal.

When using a multi-layered conductive line 120 described above, any surface that exposes both the primary conductive layer 122 and the secondary conductive layer 124 may become a galvanic corrosion initiation point. Accordingly, in some embodiments of the flexible display 100, at least some conductive lines 120 are provided with a structure in which the outer surface of the primary conductive layer 122 is surrounded by the secondary conductive layer 124 as shown in FIG. 7B. Such a configuration hinders the electrolyte from being in contact with both the primary conductive layer 122 and the secondary conductive layer 124, thereby reducing the loss of the primary conductive layer 122 by galvanic corrosion.

Such multi-layered conductive lines 120 can be created by depositing the material for the primary conductive layer 122 (e.g., Al) over the secondary conductive layer 124 (e.g., Ti). Here, the secondary conductive layer 124 underneath the primary conductive layer 122 may have greater width. Etch resist material is formed over the stack of these two layers and etched (e.g., dry etch, wet etch, etc.) to form the conductive line in a desired trace. After striping the etch resistance material, the secondary conductive layer 124 (i.e., Ti) is deposited over the patterned structure (i.e., Ti/Al). The width of the secondary conductive layer 124 deposited over the primary conductive layer 122 may be greater than the width of the primary conductive layer 122 to cover the outer surface of the primary conductive layer 122. Another round of etching and striping of the etch resistance material is performed to form a multi-layered conductive line in a desired conductive line trace design. It should be understood that the multi-layered conductive line formation processes described above are merely an example. Accordingly, some processes may be added and/or skipped in making a multi-layered conductive line.

A trace design of a conductive line is an important factor, which can affect the conductive line's electrical and mechanical properties. To meet the electrical and mechanical requirements, some portion of a conductive line may be configured differently from another portion of the conductive line. As such, a portion of a conductive line at or near the bend allowance section of the flexible display 100 may be provided with several features for bending stress management.

Bending stress management of the insulation layers near the conductive line is just as important as managing the strain of the conductive line itself. Various insulation layers, such as the buffer layer 126, the passivation layer 128, a gate insulation layer (GI layer) and an interlayer dielectric layer (ILD layer) positioned below and/or above the conductive line 120 may include a layer of inorganic materials. Layers that are formed of inorganic material, for instance a silicon oxide layer and a silicon nitride layer, are generally more prone to cracks than the metal layers of the conductive line. Even when the conductive lines have a sufficient flexibility to cope with the bending stress without a crack, some of the cracks initiated from the insulation layer can propagate into the conductive lines and create spots of poor electrical contacts in the flexible display 100.

As a trace design for reducing bending stress on a conductive line, some of the insulation layers above and/or below the layer of conductive line 120 may be patterned to reduce the chance of generating cracks. Various insulation layer patterning techniques, such as wet etching and/or dry etching processes, can be used to form a trace of insulation layer that corresponds to the trace of a conductive line. Lack of insulation layer, especially the inorganic material based insulation layer around the trace of a conductive line not only lowers the chance of crack generation, but it also cuts off the path for a crack propagation. For convenience of explanation, a trace of conductive line 120 and a trace of insulation layers covering at least some part of the conductive line 120 are collectively referred to as the "wire trace" in the following description.

As mentioned, a trace design for the conductive line and the insulation layer covering the conductive line plays an important role in increasing the robustness of the wire trace. Numerous parameters, ranging from a thickness and a width of a wire trace to a fan-out angle of a wire trace segment with respect to the bending direction of the flexible display 100, are associated with the wire trace design. In addition to the aforementioned parameters, various other parameters regarding the conductive line 120 and the insulation layer trace are specifically tailored based on the placement and the orientation of the wire trace within embodiments of the flexible display 100.

Strain on a wire trace from the bending stress will be greater as the direction in which the wire trace extends is more aligned with the tangent vector of the curvature. In other words, a wire trace will withstand better against the bending stress if the length of a wire trace segment being parallel to the tangent vector of the curvature is reduced. No matter which direction the wire trace is extended to, there will always be a portion in the wire trace that is measurable in the bending direction. However, a length for each continuous measurable portion (i.e., a segment) being aligned parallel to the bending direction can be reduced by employing a strain-reducing trace design in the wire trace.

Figure 8:
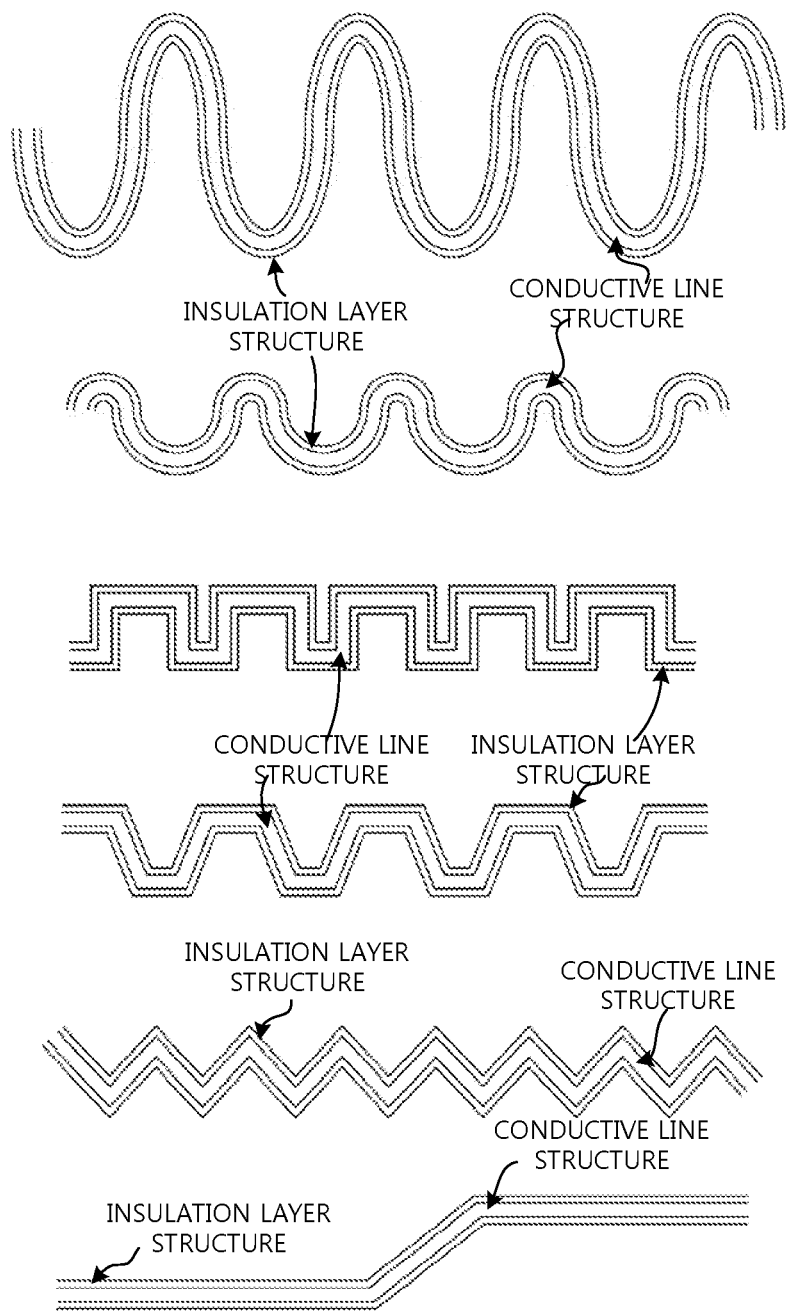
FIG. 8 illustrates strain-reducing trace designs, according to an embodiment of the present disclosure.

FIG. 8 illustrates some of the strain-reducing trace designs. Any one or more of a sine-wave, a square-wave, a serpentine, a saw-toothed and a slanted line trace designs illustrated in FIG. 8 can be used for wire traces of the flexible display 100. Employing such a strain-reducing trace design increases the portion of the wire trace arranged in a slanted orientation with respect to the tangent vector of the curvature. This, in turn, limits the length of the wire trace segment extending in a straight line parallel to the bending direction.

Since the cracks in the wire trace by bending of the flexible display generally initiate from an inorganic insulation layer, the length of the insulation layer trace being aligned with the tangent vector of the curvature should also be minimized. In the single line strain-reducing designs, the width and the shape of the conductive line trace as well as the width of the patterned inorganic insulation layers interfacing with the surface of the conductive line trace should be kept minimal.

The strain-reducing trace designs illustrated in FIG. 8 are merely exemplary, and other trace designs for reducing the length of a wire trace segment parallel to the bending direction may be used in various embodiments of the flexible display 100. Further, some wire traces may adopt different strain-reducing trace design from other wire traces in a flexible display 100 depending on their electrical and/or mechanical requirements. For instance, a strain-reducing trace design used for a data signal line may be different from a strain-reducing trace design used for a power line.

To further improve robustness, a wire trace may employ a trace design in which the wire trace repeatedly splits and converges back in a certain interval. In other words, a wire trace includes at least two sub-traces arranged to form a trace design resembling a chain with a series of connected links. The angles of split and merge define the shape of each link, which limits the length of the wire trace segment measurable in straight line parallel to the bending direction.

Figure 9A:
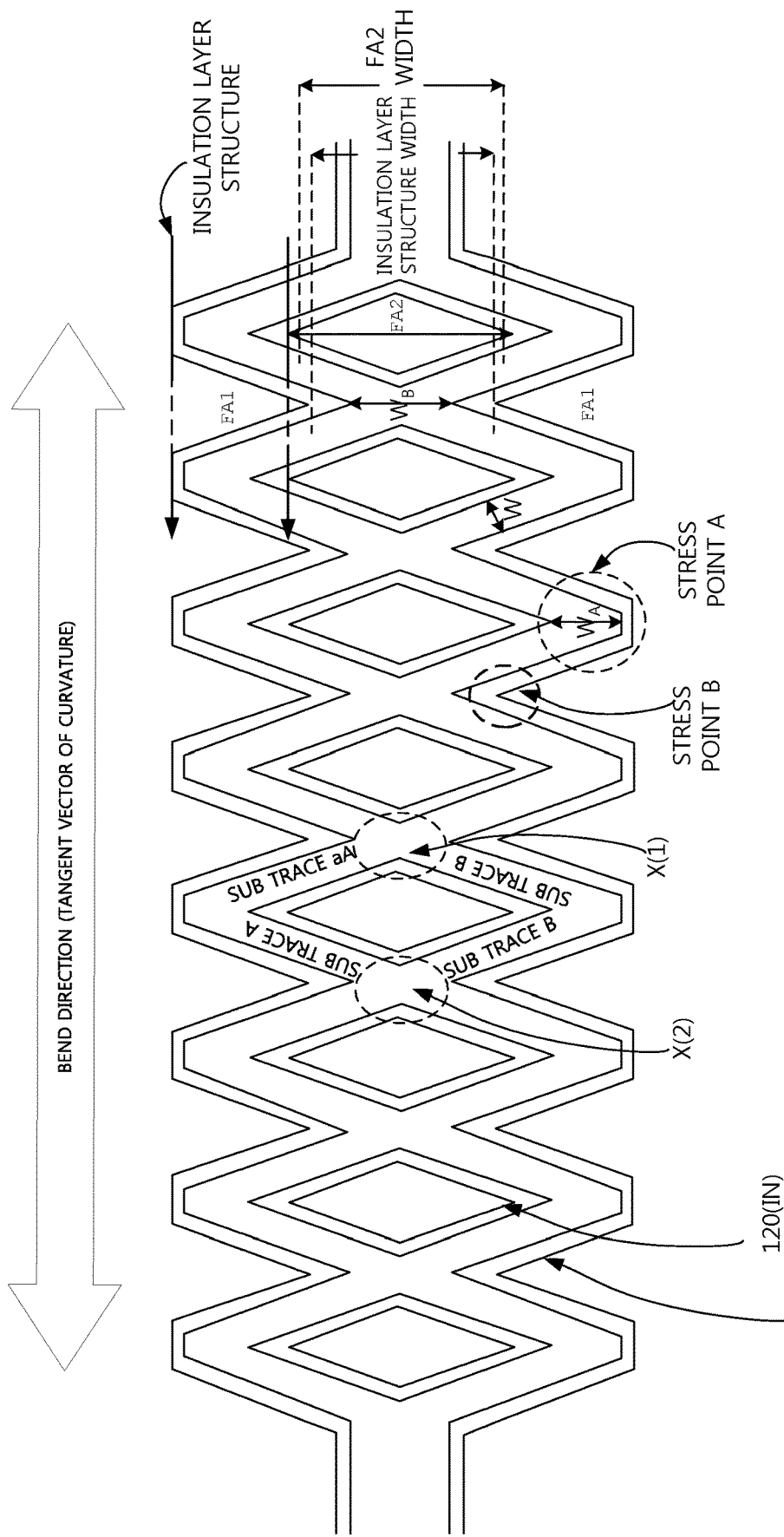
FIGS. 9A and 9B illustrate a simplified view of a wire trace having a plurality of sub traces, according to an embodiment of the present disclosure.

Referring to FIG. 9A, the conductive line 120 includes sub-trace A and sub-trace B, which are split away from each other and merge back at each joint X. Between the first joint X(1) and the second joint X(2), a part of the sub-trace A is extended for a predetermined distance in a first direction angled away from the tangent vector of the curvature, and another part of the sub-trace A is extended in a second direction. The sub-trace B is arranged in a similar manner as the sub-trace A, but in a mirrored orientation in reference to the tangent vector of the curvature. The distances and directions in which the sub-traces are arranged between the two adjacent joints X define the shape and the size of the link in the chain as well as the open area surrounded by the sub-traces. In this example, the shape of the conductive line 120 between the joint X(1) and X(2) i.e., link has a diamond shape with an open area surrounded by the sub-trace A and the sub-trace B. With additional joints X, the conductive line 120 forms a chain of diamond shaped links, and thus the trace design may be referred to as the diamond trace design.

Compared to the non-split strain-reducing trace designs shown in FIG. 8, the strain-reducing trace design shown in FIG. 9A can provide significant advantages in terms of electrical property. For instance, the wire trace provided with the split/merge trace design can provide much lower electrical resistance than the wire traces employing the mountain trace design, the sine-wave trace designs or other single line strain-reducing trace designs of FIG. 8. In addition, sub-traces can serve as a backup electrical pathway in case one of the sub-traces is damaged or severed by cracks.

The insulation layers covering the surfaces of the conductive line 120 are also patterned in a trace design corresponding to the trace design of the conductive line 120. As such, the open area surrounded by the sub-trace A and the sub-trace B is free of the inorganic insulation layer(s), or has thinner inorganic insulation layer(s) than the areas under and/or above the trace of conductive line 120. As such, the length of the insulation layer trace measurable in straight line parallel to the bending direction can be limited to reduce the chance of crack initiation and propagation.

Various additional factors must be considered for the strain-reducing trace designs based on a plurality of sub-traces. The split/merge angles and the length of each sub-trace between two adjacent joints X should provide an offset for the inorganic insulation layer at the joints X and at the outer corners where the sub-trace changes its direction between two adjacent joints X. To put it in another way, the open area, which is surrounded by the split sub-traces between two joints X of the wire trace, should have a size and a shape to minimize the length in which an inorganic insulation layer trace of the wire trace extending parallel to the bending direction.

In the diamond trace design depicted in FIG. 9A, the buffer layer 126 and the passivation layer 128 covering the trace of the conductive line 120 are patterned with a predetermined margin from the outer trace (i.e., outer edge) of the conductive line 120. Other than the insulation layers with the predetermined margin remaining to cover the conductive line 120, the open area surrounded by the sub-traces A and B, which is denoted as FA2, is free of the insulation layers. As such, a trace of insulation layers is formed in accordance with the trace design of the conductive line 120. The length of the open area without the insulation layers measured in orthogonal direction from the bending direction is greater than the width of the inorganic insulation layer trace at the joint X measured in the same direction. In this setting, the open area FA2 surrounded by the sub-traces A and B as well as the area next to the joint X can be free of the inorganic insulation layers, or otherwise provided with a reduced number of inorganic insulation layers.

Referring to FIG. 9A, the insulation layer free area FA1 prevents the insulation layer of the sub-trace A and the sub-trace B between the two joints X(1) and X(2) to be extended in a continuous straight line. Similarly, the insulation layer free area FA2 prevents the insulation layer between the two joints X(1) and X(2) to be extended in a continuous straight line. Accordingly, the length of each segment of the insulation layer trace being aligned to the tangent vector of the curvature is minimized. Further reduction in the length of each segment of the insulation layer trace aligned to the tangent vector of the curvature can be obtained by reducing the width of the conductive line 120 and the margin of the insulation layer beyond the edge of conductive line 120.

It should be noted that the amount of reduction in the width of conductive line 120 is limited with the single line strain-reducing trace designs depicted in FIG. 8 because the reduction of conductive line width can make its electrical resistance too high for its particular use within the flexible display 100. With the split/merge trace design of FIG. 9A, however, the width of the conductive line 120 and the insulation layer trace can be reduced while providing sufficient electrical property.

Greater split/merge angle of the sub-traces with respect to the bending direction may reduce the lengths of the conductive line 120 and the insulation layer trace extending along the tangent vector of the curvature to a greater extent. Accordingly, a lower chance of crack initiation may be afforded in the wire trace by selectively increasing the split/merge angle of sub-traces at high bending stress regions.

It should be noted that the split angle of the sub-traces can affect the distance between the two adjacent joints X in the diamond trace design. The distance between the joints X need not be uniform throughout the entire wire trace. The intervals at which the trace splits and merges can vary within a single trace of wire based on the level of bending stress exerted on the parts of the wire trace. The distance between the joints X may be progressively shortened down for the parts of the wire trace towards the area of the flexible display 100 subjected to higher bending stress (e.g., area having smaller bend radius, area having larger bend angle). Conversely, the distances between the joints X can progressively widen out towards the area subjected to lower bending stress.

Even with the strain-reducing trace design, the inevitable bending stress remains at certain points of the trace (i.e., stress point). The location of stress point is largely dependent on the shape of the trace as well as the bending direction. It follows that, for a given bending direction, the wire trace can be designed such that the remaining bending stress would concentrate at the desired parts of the wire trace. Knowing the location of the stress point in the wire trace, a crack resistance area can be provided to the stress point to make the wire trace last longer against the bending stress.

Referring back to FIG. 9A, when a wire trace having the diamond trace design is bent in the bending direction, the bending stress tends to focus at the angled corners (i.e., the vertexes of each diamond shaped link), which are denoted as the stress point A and stress point B. As such, cracks tend to initiate and grow between the inner and outer edges of the wire trace. For instance, at the stress points A, a crack may initiate from the inner trace line 120(IN) and grow toward the outer trace line 120(OUT). Similarly, a crack may initiate from the outer wire trace line 120(OUT) and grow toward the inner trace line 120(IN) at the stress points B.

Accordingly, the width of the conductive line 120 at the stress points A can be selectively increased to serve as the crack resistance area. As depicted in FIG. 9A, the widths ($W_A$, $W_B$) of the conductive line 120 at the stress points A and B, which are measured in the direction perpendicular to the bending direction, may be longer than the width (W) of the conductive line 120 at the parts between the stress points A and B. The extra width at the stress points can make the conductive line 120 held out longer before a complete severance in the conductive line 120 occurs by the growth of a crack at the stress points.

The length for the continuous portion of the insulation layer trace being aligned to the bending direction should be kept minimal. Increasing the width of the conductive line 120 at the stress points A and B may necessitate increase in the width of the insulation layer trace at the respective area, which results in lengthening the insulation layer trace being aligned parallel to the bending direction.

Accordingly, in some embodiments, the width of the conductive line 120 measured in the direction perpendicular to the tangent vector of the curvature at the stress points A ranges from about 2.5 um to about 8 um, more specifically, from about 3.5 um to about 6 um, more specifically from about 4.5 um to about 8.5 um, and more specifically at about 4.0 um. The width of the conductive line 120 at the stress points B should also be maintained in the similar manner as the width of the conductive line 120 at the stress points A. As such, the width of the conductive line 120 at the stress points B may range from about 2.5 um to about 8 um, more specifically, from about 3.5 um to about 6 um, more specifically from about 4.5 um to about 8.5 um, and more specifically at about 4.0 um. Since the sub-trace A and the sub-trace B merges at the stress point B, the width of the conductive line 120 at the stress points B may be longer than width at the stress points A.

In some embodiments, one of the inner trace line 120(IN) and the outer trace line 120(OUT) may not be as sharply angled as the other trace line at the stress points A to minimize the chance of crack initiating from both sides. In the embodiment depicted in FIG. 9A, the inner trace line 120(IN) is more sharply angled than the outer trace line 120(OUT) at the stress points A. However, in some other embodiments, the outer trace line 120(OUT) may be more sharply angled than the inner trace line 120(IN) at the stress points A. In both cases, the less sharply angled trace line can be more rounded rather than being a straight line as the outer trace line 120(OUT) depicted in FIG. 9A. Further, both the inner trace line 120(IN) and the outer trace line 120(OUT) at the stress points A can be rounded.

Figure 9B:
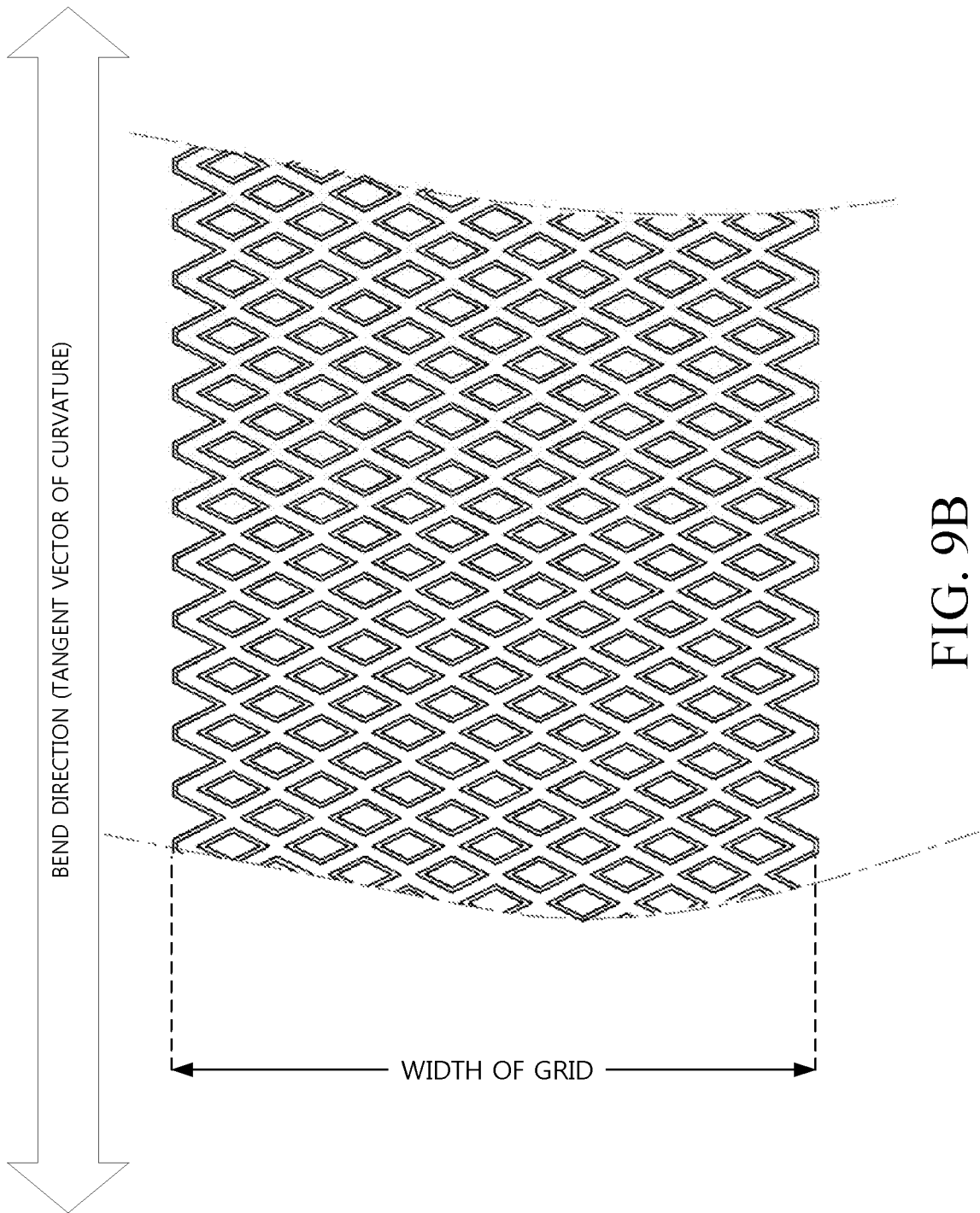

The wire trace may split into additional number of sub-traces, resulting series of links arranged in a grid-like configuration. As an example, a wire trace can be configured as a web of diamond trace shapes as illustrated in FIG. 9B.

Such a trace design is particularly useful for a wire trace that transmit a common signal to multiple points or for a wire trace that require a very low electrical resistance. For example, a VSS line and a VDD line in the flexible display 100 may have the grid-like trace design, especially if such lines are arranged to cross over a bend allowance section. Neither the number of sub-traces nor the shapes of the sub-traces of the grid-like trace design are particularly limited as the design depicted in FIG. 9B.

In some embodiments, the grid width can be reduced or increased in between two ends within the flexible display 100. Also, the grid-like wire trace shown in FIG. 9B can converge back to form the diamond trace shown in FIG. 9A or to form a non-split strain-reducing trace design. In some cases, the size of each diamond-shaped trace of a grid-like wire trace may be larger than the size of each diamond-shaped trace of a diamond-chain trace to reduce the resistance.

Due to the portions angled away from the bending direction, a wire trace with a strain-reducing trace design may necessitate a larger routing area within the flexible display 100. In embodiments where an inactive area at the edge of the flexible display 100 is bent, the increase in the routing area for accommodating the wire traces can actually increase the size of the inactive area to be hidden under a masking.

Accordingly, wire traces applied with a strain-reducing trace design may be arranged to facilitate tight spacing between adjacent wire traces. For instance, two adjacent wire traces with a strain-reducing trace design may each include a non-linear section, which would have a convex side and a concave side. The two adjacent wire traces can be arranged in the flexible display such that the convex side of the non-linear section in the first wire trace is positioned next to the concave side of the non-linear section in the second wire trace. Since the spacing between the two adjacent wire traces is limited by the shape and the size of the wire traces, the non-linear section in the strain-reducing trace design of the first wire trace may be larger than the non-linear section in the strain-reducing trace design of the second wire trace. One of the first wire trace and the second wire trace may have a different strain-reducing trace design to better accommodate the non-linear section of the other wire trace.

In some instances, two or more wire traces arranged next to each other may each be applied with a strain-reducing trace design, and each of the wire traces may have a plurality of indented sections and distended sections (e.g., extended sections). In such cases, the wire traces can be arranged such that the distended section of one of the wire traces to be positioned next to the indented sections of the adjacent wire trace.

Figure 10:
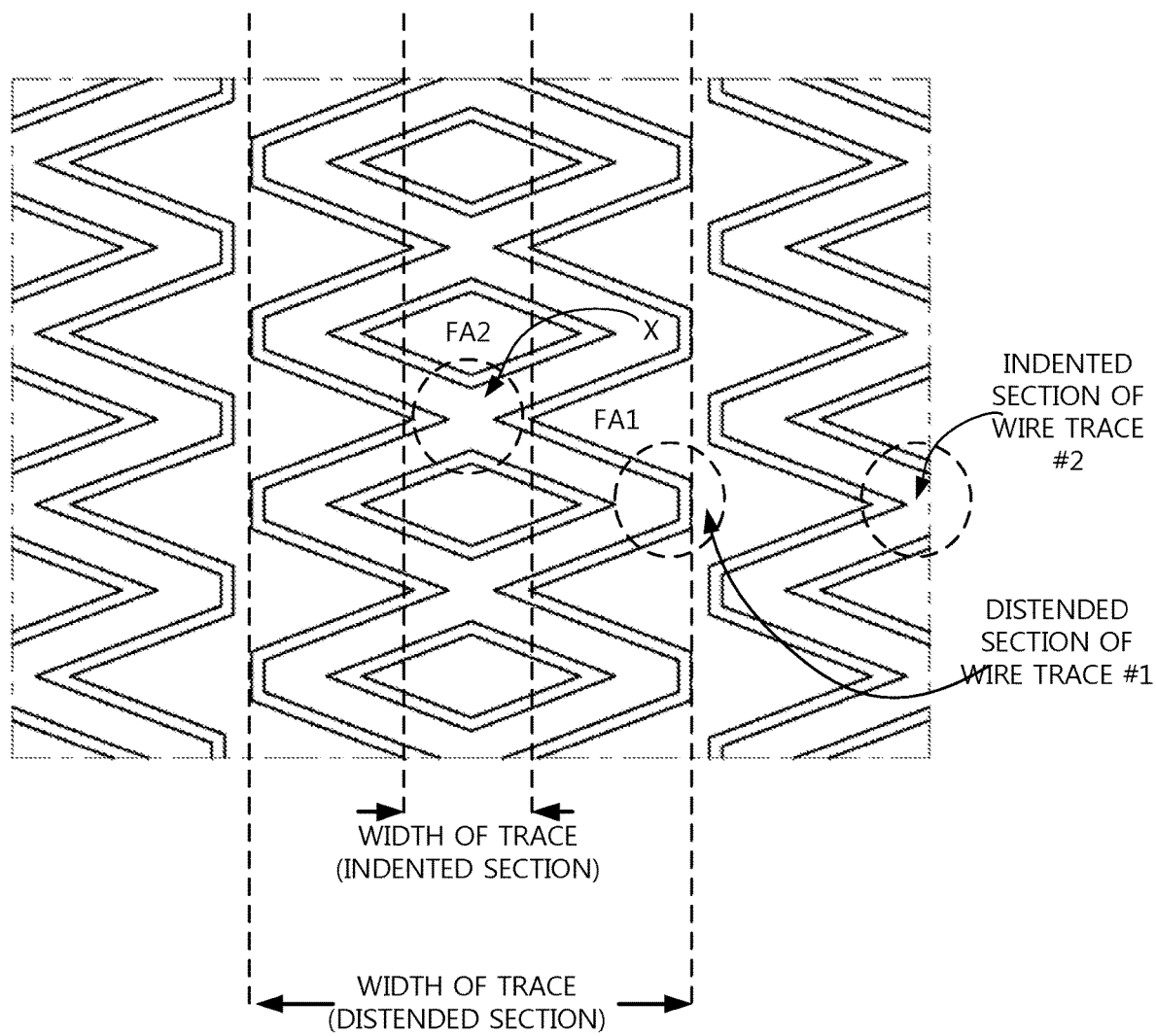
FIG. 10 illustrates an arrangement of multiple wire traces having a diamond trace design, according to an embodiment of the present disclosure.

FIG. 10 illustrates an arrangement of multiple wire traces, each having the diamond trace design described above. The split of the sub-traces widens the layout of the wire trace to create the distended section, whereas merging of the sub-traces narrows the layout of the wire trace to create the indented section. Accordingly, in terms of its layout, the indented section of the wire trace is at the joint X, whereas the distended section of the wire trace is at the point where the split/merge angles of the sub-traces change between two adjacent joints X.

As shown in FIG. 10, position of the joints X in a first wire trace and the joints X in a second wire trace are arranged in a staggered configuration. In this arrangement, the vertexes of the diamond shaped link at the distended section in the first wire trace are positioned next to the joints X at the indented sections of the adjacent wire traces. Such a staggered arrangement of the wire traces may help in lowering the electrical noises on the wire traces due to close proximity between the wire traces, and thus the distance between the wire traces can be reduced. Even a tight spacing between the wire traces may be possible by arranging the distended section of a wire trace to be positioned closer toward the indented section of the adjacent wire trace. For instance, the vertexes at the wide parts of one wire race can be placed in the open area FA1, which is created by the split/merge angle and the length of the sub-trace in the adjacent wire trace. As such, the staggered arrangement allows a certain minimal distance to be maintained between the wire traces while reducing the amount of space taken up by the wire traces.

Figure 11A:
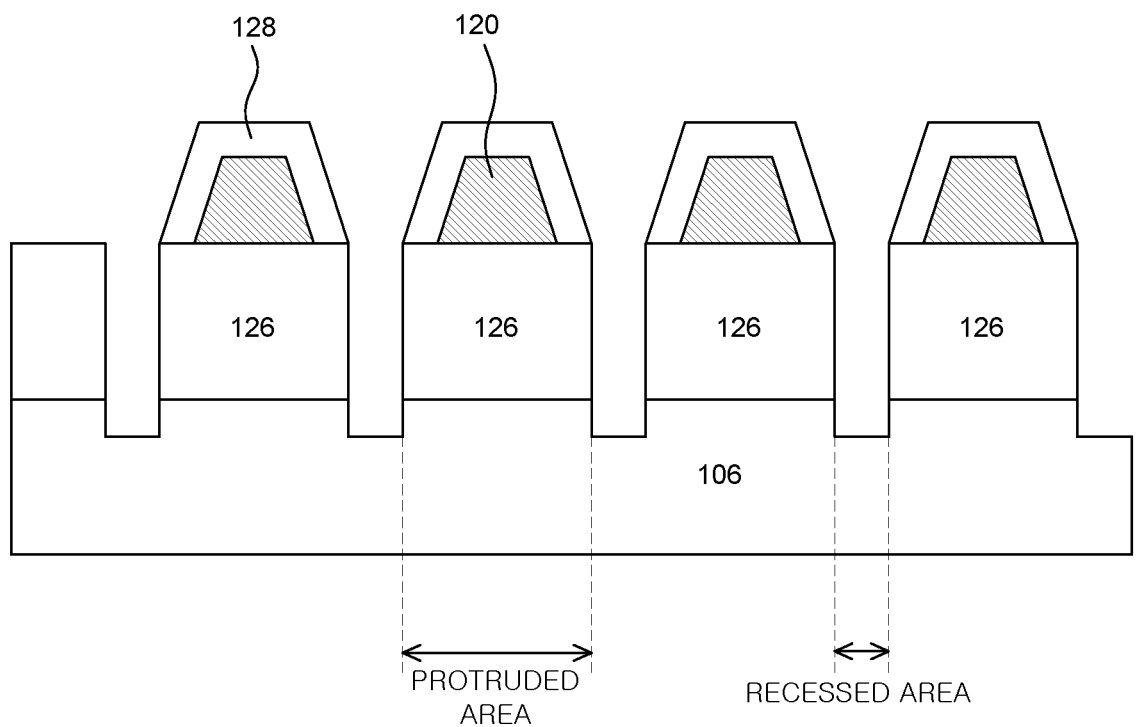
FIGS. 11A and 11B illustrate simplified cross-sectional views of a wire trace, according to an embodiment of the present disclosure.
Figure 11B:
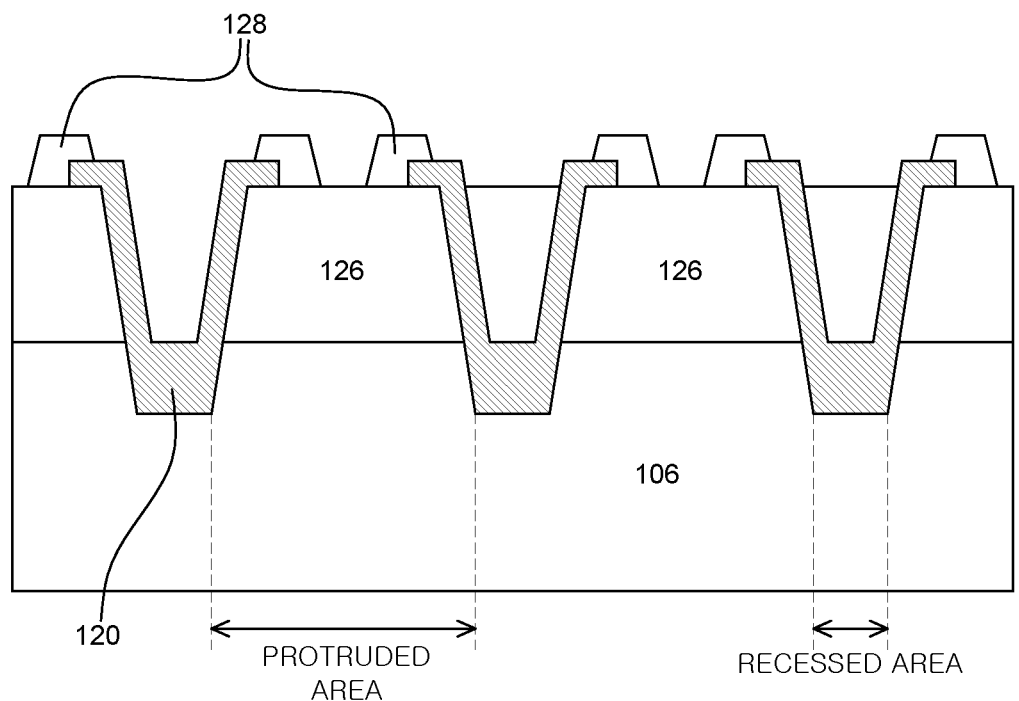

FIGS. 11A and 11B illustrate schematic cross-sectional views of trace designs usable for wire traces in a flexible display according to embodiments of the present disclosure.

It should be noted that cracks primarily initiate from the inorganic insulation layers. Accordingly, propagation of cracks can be suppressed by selectively removing inorganic insulation layers from the areas prone to cracks. To achieve this, one or more inorganic insulation layers and/or stack of insulation layers including a layer of inorganic material can be selectively etched away at various parts of the flexible display 100.

For example, the insulation layer under the conductive line 120 can be etched away. The insulation layer under the conductive line 120 may be the buffer layer 126, which may include one or more layers of inorganic material layers. The buffer layer 126 may be formed of one or more layers of a SiNx layer and a SiO2 layer. In one suitable configuration, the buffer layer 126 may be formed of alternating stacks of a SiNx layer and a SiO2 layer. The buffer layer 126 is disposed on the base layer 106, but under the TFT.

To facilitate easier bending of the flexible display 100, a part of the buffer layer 126 may etched away in the bend portion of the flexible display 100. Accordingly, the buffer layer 126 formed on the substantially flat portion of the base layer 106 may be thicker than the buffer layer 126 over the bend portion of the base layer 106. When the buffer layer 126 is formed in a stack of multiple sub-layers, the buffer layer 126 in the substantially flat portion of the flexible display 100 may include one or more additional sub-layers than the buffer layer in the bend portion of the flexible display 100.

For example, the buffer layer 126 in the substantially flat portion may include multiple stacks of a SiNx layer and a SiO2 layer, and the buffer layer 126 in the bend portion includes a single stack of a SiNx layer and a SiO2 layer. It is also possible to have only a single layer of either a SiNx layer or a SiO2 layer in some part of the bend portion. In one configuration, each SiNx layer and SiO2 layer in the buffer layer 126 may have a thickness of about 1000 Å. As such, the thickness of the buffer layer 126 in the bend portion of the flexible display may range from about 100 Å. to about 2000 Å.

In the substantially flat portion of the flexible display 100, an additional layer of inorganic layer may be provided immediately below the semiconductor layer of the TFT, which may be referred to as the active buffer. In some embodiments, an inorganic layer, which is most closely positioned under the active layer of the TFT, may be much thicker than the individual inorganic layers of the buffer layer 126.

The buffer layer 126 in the bend allowance section may be etched even further to expose the base layer 106 while leaving the buffer layer 126 intact under the conductive line 120. In other words, a recessed area and a protruded area are provided in the bend portion of the flexible display 100. The protruded area includes the buffer layer 126 provided on the base layer 106, whereas the recessed area has the base layer 106 exposed without the buffer layer 126 disposed thereon.

In one configuration shown in FIG. 11A, the conductive line 120 is positioned on the protruded area, and the passivation layer 128 is positioned over the conductive line 120 on the protruded area. Although the passivation layer 128 may not be deposited over the recessed area, the passivation layer 128 can be removed from the recessed area by a dry etch or a wet etch process. As such, the recessed area can be substantially free of the passivation layer 128. When etching the passivation layer 128 from the recessed area, part of the base layer 106 can be etched as well. Accordingly, the thickness of the base layer 106 at the recessed area can be lower than that of the base layer 106 elsewhere in the flexible display 100. When the buffer layer 126 is etched away as shown in FIG. 11A, propagation of crack from one part of the buffer layer 126 to another part of the buffer layer 126 can be hindered by the space in the recessed area. Similarly, propagation of cracks by the passivation layer 128 is also hindered by the space of the recessed area. Accordingly, damage to the conductive line 120 by propagation of cracks can be reduced.

In another configuration shown in FIG. 11B, the recessed area includes the base layer 106 that is etched to a certain depth, and the conductive line 120 is deposited on the base layer 106 of the recessed area. In this setting, the portion of the conductive line 120 is disposed within the base layer 106. Some part of the conductive line 120 is also deposited on a part of the buffer layer 126 that is provided in the protruded area. A passivation layer 128 can be deposited over the conductive line 120, and then etched away from the recessed area to expose the conductive line 120 in the recessed area.

Accordingly, the passivation layer 128 remains on the conductive line 120 positioned on the protruded area. In this configuration, the passivation layer 128 remaining on the buffer layer 126 can inhibit galvanic corrosion as it covers the cross-sectional side surface of the multi-layered conductive line 120. While cracks generated from the buffer layer 126 may penetrate to the conductive line 120 on the wall of hollow space in the buffer layer 126, the cracks may be prevented from reaching the part of the conductive line 120 positioned within the base layer 106.

When the conductive line 120 has the multi-layered structure discussed above, the part of the conductive line 120 in the recessed area need not be covered by the passivation layer 128. With the passivation layer 128 removed from the surface of the conductive line 120 in the recessed area, crack propagation from the passivation layer 128 can also be prevented. Further, galvanic corrosion generally starts from the edge of the conductive line 120 on the buffer layer, and thus the passivation layer 128 covering the edge of the conductive line 120 on the buffer layer 126 may not be needed if the distance between the conductive line 120 on the buffer layer 126 and the conductive line 120 in the base layer 106 is sufficiently spaced apart from each other. The configurations shown in FIGS. 11A and 11B may be used for the wire traces in the bend allowance section with the strain-reducing trace patterns of FIGS. 8, 9A and 9B. In addition to the bend allowance section, in some embodiments, the patterned insulation layer may also be provided in the routing area between the active area and the bend allowance section as well as the routing area between the COF bonding area and the bend portion.

Further, the patterned insulation layer described above can be provided in the active area. However, removal of inorganic insulation layers near the TFTs of the flexible display 100 may affect the electrical characteristic of components in the flexible display 100. For instance, undesired threshold voltage shift of TFTs may result when some part of the buffer layer 126 is removed. In order to maintain the stability of the TFTs, an additional shield metal layer can be formed under the semiconductor layer of the TFTs. The shield metal layer may be under the buffer layer 126 or interposed between the inorganic layers of the buffer layer 126. In some embodiments, the shield metal layer may be electrically connected to the source electrode or gate electrode of the TFTs.

In addition to the patterning of insulation layers in various parts of the flexible display 100, other structural elements can be removed or simplified in some areas of the flexible display 100 to facilitate bending. For example, the touch sensor layer 112, the polarization layer 110 and the likes may be absent in the bend allowance section of the flexible display 100. Absence or simplification of these elements would create a number of uneven surfaces where the wire trace may need to cross.

When a wire trace is laid over such an uneven surface, some parts of the wire trace may be placed on a different plane level from another parts of the wire trace. As the parts are on different plane levels, the amount and direction of bending stress and the strain resulting from the bending stress can differ even among the parts of the wire trace. To accommodate the difference, a strain-reducing trace design for the wire traces can include a modified trace design for the portion of the wire trace on the uneven surfaces.

Figure 12A:
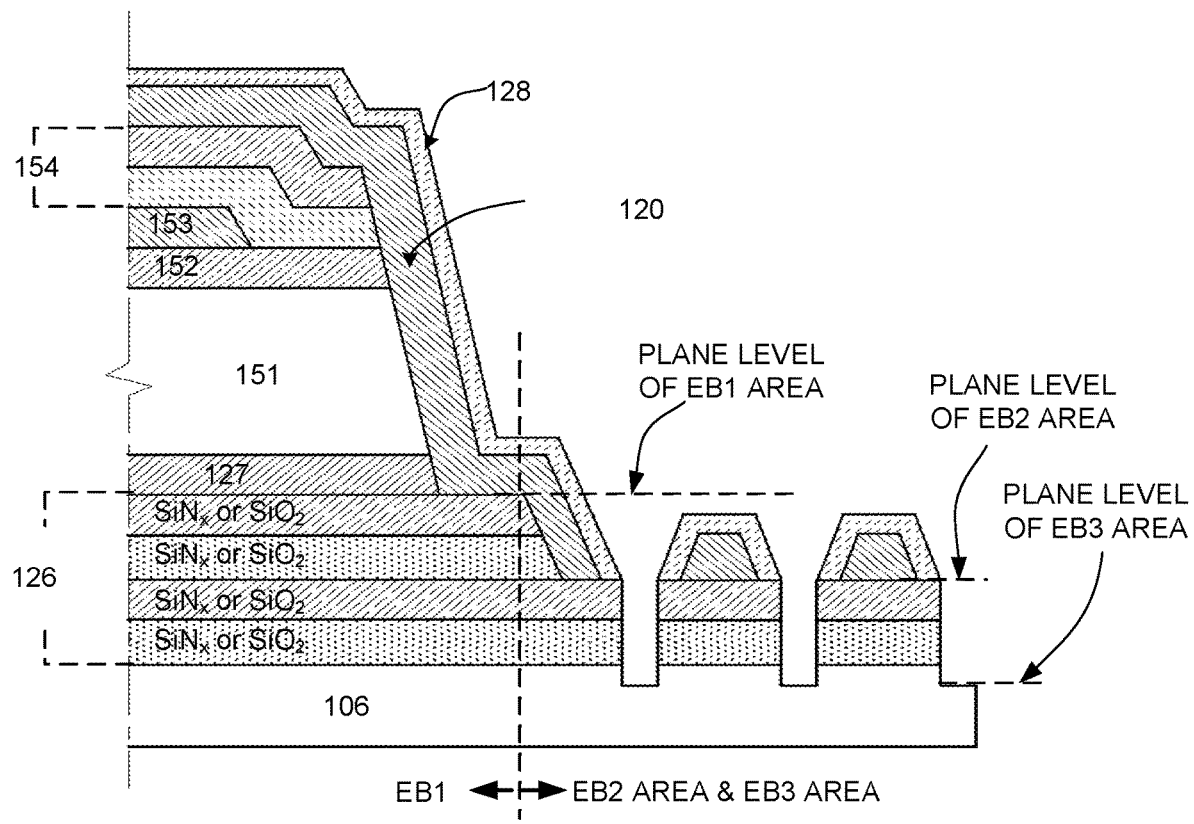
FIGS. 12A and 12B illustrate simplified views of a strain-reducing wire trace having a modified part, according to an embodiment of the present disclosure.

FIG. 12A is an enlarged cross-sectional view showing a backplane configuration for a flexible display 100, in which several insulation layers are removed from the bend portion to facilitate more reliable bending, according to an embodiment of the present disclosure.

Several organic and inorganic layers may be formed between the base layer 106 and the OLED element layer 150. In this particular example, alternating stacks of SiNx and SiO2 layers can be disposed on the base layer 106 to serve as the buffer layer 126. The semiconductor layer 151 of a TFT may be sandwiched by an active-buffer layer 127 and a gate insulation layer 152 that are formed of SiO2 layer. The gate 152 of the TFT is disposed on the gate insulation layer 152, and metal layer (same metal with the source/drain of the TFT) having the multi-layered structure as discussed above is sandwiched between the ILD 154 and a passivation layer 128. Here, the ILD 154 may be formed of a stack of SiNx and SiO2, and the passivation layer 128 is formed of SiNx. Then, a planarization layer is disposed over the passivation layer 128 so that the anode for the OLED can be disposed thereon.

As mentioned above, use of the strain-reducing trace design is not just limited to the part of the wire traces within the bend portion. Also, the strain-reducing trace design can be applied to the part of the wire traces in the routing areas outside the bend allowance section. Using the strain-reducing trace design for the wire trace in such routing area can afford increased protection to the wire trace against the bending stress.

In the routing area, however, several layers of organic and/or inorganic material layers between the base layer 106 and the OLED element layer 150 may be absent to facilitate bending of the flexible display 100. Such organic and/or inorganic layers, including but not limited to the ILD 154, the gate insulation layer 152, buffer layer 126, 127, passivation layer 128, planarization layer, etc. may not be present in the bend portion of the flexible display 100. Some of these layers may have been removed from the area by several etching processes.

By way of example, several insulation layers on the buffer layer 126 may be etched by a first etch process EB1, which is followed by the second etch process EB2 that etches away the active buffer layer 127 and a part of the buffer layer 126 (e.g., a stack of a SiNx layer and a SiO2 layer). These etching processes create multiple stepped regions as shown in FIG. 12A, with one or more of vertically sloped surfaces and horizontally leveled surfaces, where the conductive line is disposed thereon. The conductive line laid over the vertically sloped surfaces and horizontally leveled surfaces would have several bent spots, such as a stepped region between a high-leveled surface and a low-leveled surface.

When bending the flexible display 100 in the bending direction, the wire trace may experience more strain at or near the stepped region. Numerous tests and experiments conducted by the present inventors indicate that the chance of a crack is especially higher in the wire trace crossing over the stepped region between the EB1 area and the EB2 area (and the EB3 area). Accordingly, in some embodiments, the strain-reducing trace design for the wire trace has a reinforced portion at or near the stepped region between a high-leveled surface and a low-leveled surface provided by insulation layers of the flexible display.

Figure 12B:
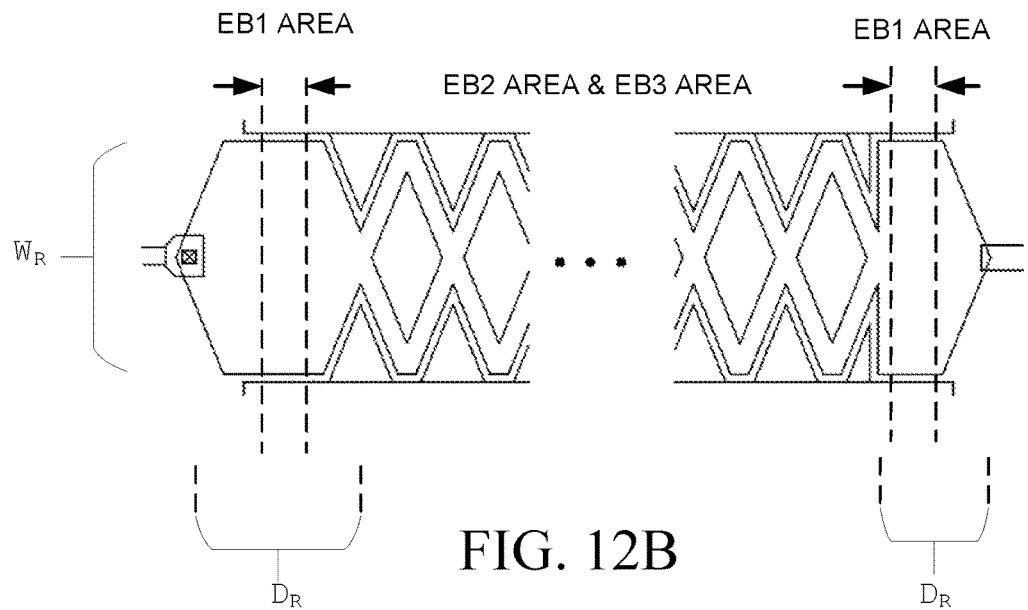

In the example shown in FIG. 12B, the wire trace has a simple straight line trace at its both ends. However, the part of the conductive line 120 that crosses over the bent areas EB1 and EB2 (and EB3) is reinforced with a modified trace design. At the modified portion, the conductive line 120 having a wider width with extra width $W_R$ is provided to ensure the preservation of the conductive line 120 even if cracks initiate from the insulation layer near EB1 and EB2 areas. The distance $D_R$ in which provided in the modified trace design depends on the thickness of the insulation layers etched by the etch processes as well as the distance between the first leveled surface (e.g., plane level at EB1) and a second leveled surface (e.g., plane level at EB2).

It should be appreciated that the strain-reducing trace design of the wire trace applied with the modified portion is not limited to the strain-reducing trace design depicted in FIG. 12B. Various embodiments of the strain-reducing trace design can include a modified trace design for the portion of the wire trace corresponding to the stepped areas of two differently leveled surfaces.

While this may not always be the case, the routing areas adjacent to the bend allowance section may be the substantially flat portions of the flexible display 100. In such cases, the EB1 and EB2 areas would be positioned at or just outside start of the bend allowance section in the bend portion, and the wire trace may be provided with the reinforced portion in its trace design.

The increased width $W_R$ of the reinforced conductive line 120 portion may serve its purpose well at or near the beginning and the end of the bend allowance section where the curvature is relatively small. The wider width $W_R$ of the wire trace and the length in which the modified trace portion is applied in the wire trace can increase the length of the wire trace that is aligned parallel to the bending direction. This would make the wire trace harder to hold out against the bending stress at the region with greater bend radius.

For this reason, the distance $D_R$ in which the reinforced portion is provided should be limited such that the reinforced conductive line portion does not extend too much toward the bend allowance section. Accordingly, the distance $D_R$ of the reinforced conductive line portion may be limited such that the trace design of the reinforced conductive line portion does not extend beyond the bend allowance section where it is bent more than a predetermined threshold bend angle. By way of an example, the reinforced conductive line portion may not extend beyond the point where it is 30° curved away from the tangent plane of the curvature. The threshold bend angle may be less than 20°, for example 10°, and more specifically less than 7°.

The wire trace, which is provided with the reinforced portion at the stepped areas, may extend across the bend allowance section and be routed to pads for COF or other components of the flexible display 100. In such instances, additional stepped region (similar to EB1 and EB2) may exist at or near the opposite end of the bend allowance section. The conductive line at or near such bent spots may be reinforced in the similar manner as the modified portion of the wire trace at the opposite end as shown in FIG. 12B. If desired, the reinforced conductive line portion at or near the stepped regions at the opposite ends of the bend allowance section may have a different shape as depicted in FIG. 12B.

Figure 13A:
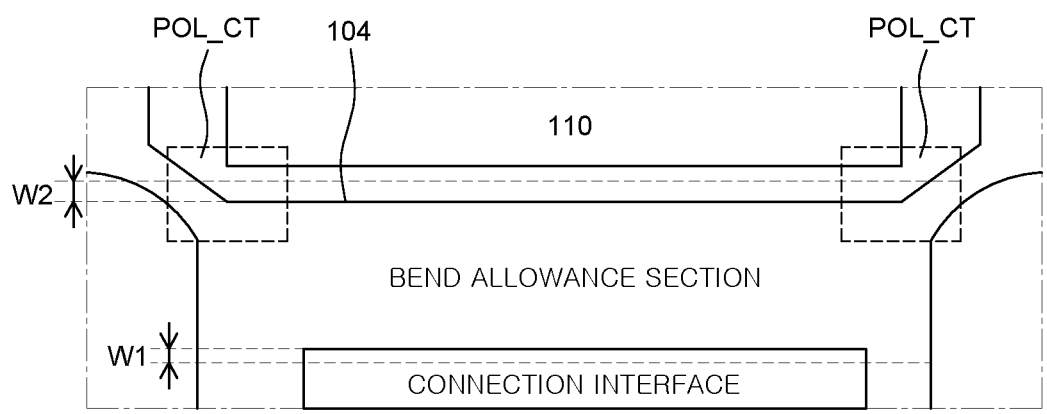
FIGS. 13A to 13C are views illustrating a configuration of a protective coating layer used for a flexible display, according to an embodiment of the present disclosure.
Figure 13B:
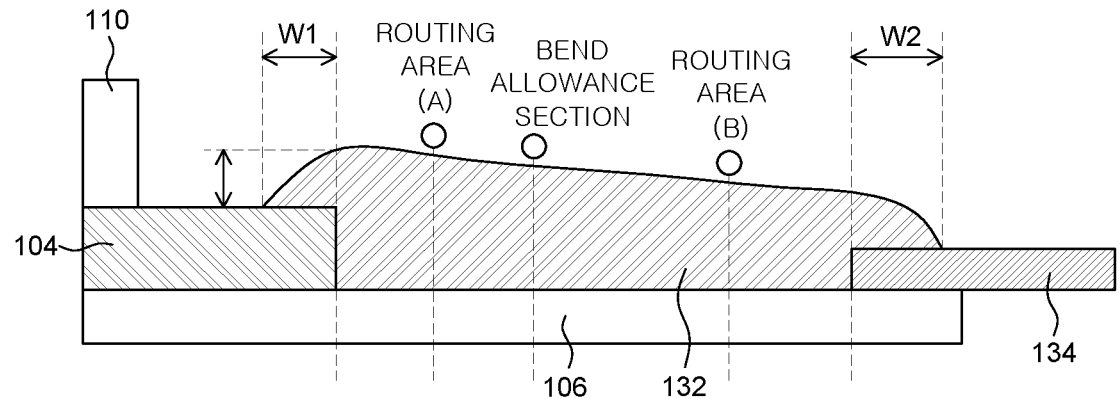
Figure 13C:
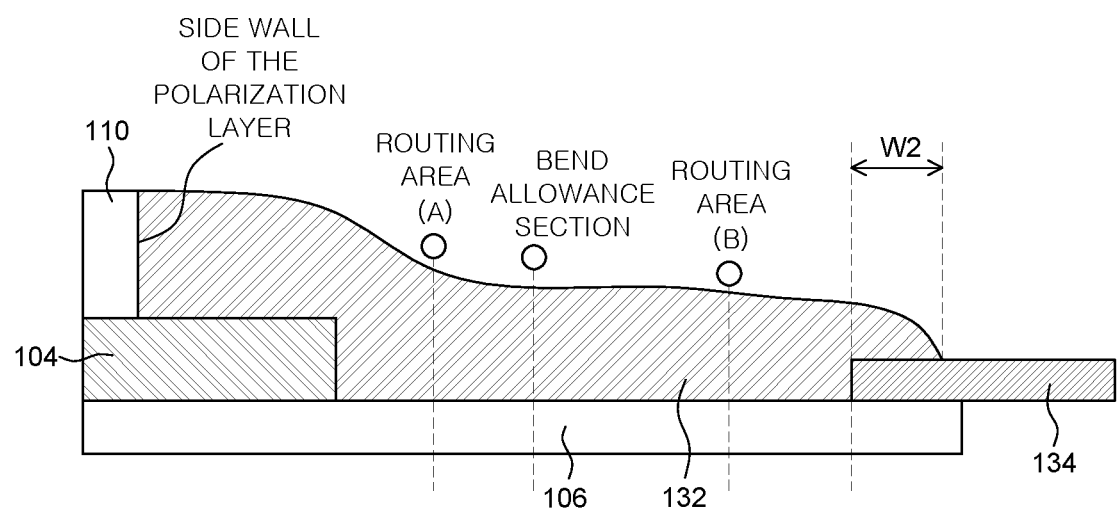

FIGS. 13A to 13C are views illustrating a protective coating layer used for a flexible display according to an embodiment of the present disclosure.

When several layers are not provided in a bend portion of the flexible display 100, a passivation layer may be used for conductive lines, specifically, wire traces in the bend allowance section. Further, since an inorganic insulation layers may be etched at the bend portion of the flexible display 100, conductive lines of the bend portion may be susceptible to moisture or other foreign matters. Specifically, various pads and conductive lines for testing parts during the manufacturing process of the flexible display 100 may be chamfered, which may remain a conductive line extending to an grooved edge of the flexible display 100. The conductive lines may be easily corroded by moisture and the corrosion may expand to neighboring conductive lines. Accordingly, a protective coating layer which may also be referred to as a "micro-coating layer" may be provided on the conductive line and/or the wire trace of the bend portion.

The protective coating layer 132 may be coated on a bend allowance section with a thickness which is determined to adjust a neutral plane of the flexible display 100 in the bend portion. More specifically, a thickness added to the protective coating layer 132 in the bend portion may move the plane of the conductive line and/or the wire trace to be closer to the neutral plane.

In some embodiments, in a region between a barrier film 104 and a printed circuit board 134, a thickness of the micro-coating layer 132 measured from a surface of the base layer 106 may be substantially the same as a thickness (from the base layer 106 to an upper surface of the barrier film 104) of the barrier film 104.

The barrier film as described herein refers to a film laminated over a light emitting element to provide protection from external contaminants or moisture. The barrier film is separate and distinct from the encapsulation of the light emitting element.

The protective coating layer 132 should have a sufficient flexibility to be used in the bend part of the flexible display 100. Further, the protective coating layer 132 may be formed of a material which is cured at a low energy within a limited time so that components disposed therebelow are not damaged during the curing process. For example, the protective coating layer 132 may be formed of a photo (for example, UV ray or visible ray) curable acryl resin. In order to suppress permeation of the moisture through the protective coating layer 132, one or more moisture absorbing materials (getter) may be mixed to the protective coating layer 132.

Various resin application methods to apply the protective coating layer 132 on a determined surface, such as a slit coating method or jetting method, may be used. As another example, the protective coating layer 132 may be applied using a spraying valve. An application rate from the spraying valve may be adjusted during the coating process to precisely control the thickness and diffusion of the protective coating layer 132. Further, the number of spraying valves which apply the protective coating layer 132 is not specifically limited. The number of spraying valves may vary so as to adjust a diffusion amount and an application time before the protective coating layer 132 is cured.

FIG. 13A illustrates a configuration of the protective coating layer 132. As mentioned above, the protective coating layer 132 may be coated in the region between the barrier film 104 and the printed circuit board 134 attached in the inactive area. However, depending on an adhesion characteristic and an intensity of stress of the protective coating layer 132, the protective coating layer 132 may be separated from the barrier film 104 and/or the printed circuit board 134. An open space between the protective coating layer 132 and the barrier film 104 or the printed circuit board 134 may serve as a defective region into which moisture may be permeated.

Therefore, in some embodiments, the protective coating layer 132 may be disposed to partially overflow above the barrier film 104, as illustrated in FIGS. 13A to 13C. That is, a part of the upper surface of the edge of the barrier film 104 may be covered with the protective coating layer 132. A region which is in contact with the surface of the barrier film 104 suppresses the separation of the protective coating layer 132 from the barrier film 104 due to the bend stress. Improved sealing provided by the protective coating layer 132 at the edge of the barrier film 104 may reduce corrosion of the conductive lines in the bend portion. Similarly, the protective coating layer 132 may be applied above at least a part of the printed circuit board 134 to improve the sealing of the edge of the printed circuit board 134.

Referring to FIGS. 13B and 13C, a width of a region on the barrier film 104 covered with the protective coating layer 132 is denoted by "W1" and a width of a region on the printed circuit board 134 covered with the protective coating layer 132 is denoted by "W2". A size (area) of the protective coating layer 132 which covers the barrier film 104 and the printed circuit board 134 is not specifically limited and may vary depending on an adhesiveness of the protective coating layer 132.

As illustrated in FIG. 13B, the flexible display 100 may include a part of the protective coating layer 132 on the barrier film 104 which is spaced apart from the edge of the polarization layer 110. However, in some embodiments, as illustrated in FIG. 13C, the flexible display 100 may include a part of the protective coating layer 132 on the barrier film 104 which is in contact with the polarization layer 110.

A diffusing force of the applied protective coating layer 132 is determined not only by the viscosity but also by a surface energy of a location where the protective coating layer 132 is applied. The protective coating layer 132 which overflows above the barrier film 104 may reach the polarization layer 110. The protective coating layer 132 which is in contact with a side wall of the polarization layer 110 may help to fix the polarization layer 110 in place. However, the protective coating layer 132 which reaches the side wall of the polarization layer 110 may be disposed above the side wall of the polarization layer 110. The side wall wetting of the protective coating layer 132 may generate uneven edges on the surface of the polarization layer 110, which may cause various problems when another layer is disposed thereon. Therefore, an amount of the protective coating layer 132 which is applied on a specific surface may be adjusted so as to control the width. Furthermore, the protective coating layer 132 may be applied such that only some of selected regions of the polarization layer 110 are in contact with the protective coating layer 132.

Figure 14A:
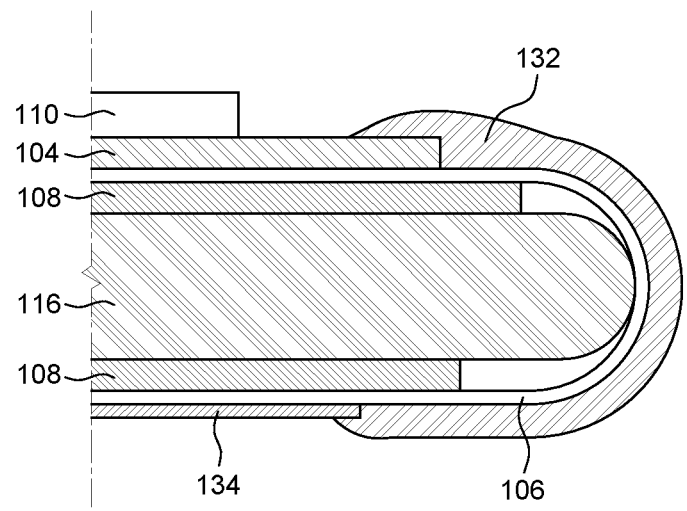
FIGS. 14A and 14B are views illustrating a flexible display to which a protective coating layer is applied, according to an embodiment of the present disclosure.
Figure 14B:
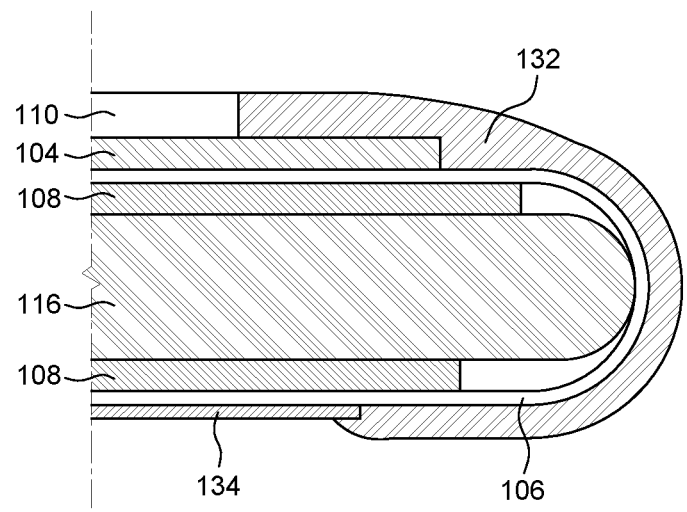

In one configuration example, the protective coating layer 132 may be in contact with the polarization layer 110 at two opposing corners ("POL_CT" in FIG. 13A), but the protective coating layer 132 does not reach the edge of the polarization layer 110 between two corners. The protective coating layer 132 between two opposing corners POL_CT covers only a part of the barrier film 104. After the bending process, a part of the flexible display 100 in which the protective coating layer 132 is spaced apart from the polarization layer 110 may be configured as illustrated in FIG. 14A. In a region configured such that the protective coating layer 132 is in contact with the polarization layer 110, the flexible display 100 may be configured as illustrated in FIG. 14B.

Figure 15A:
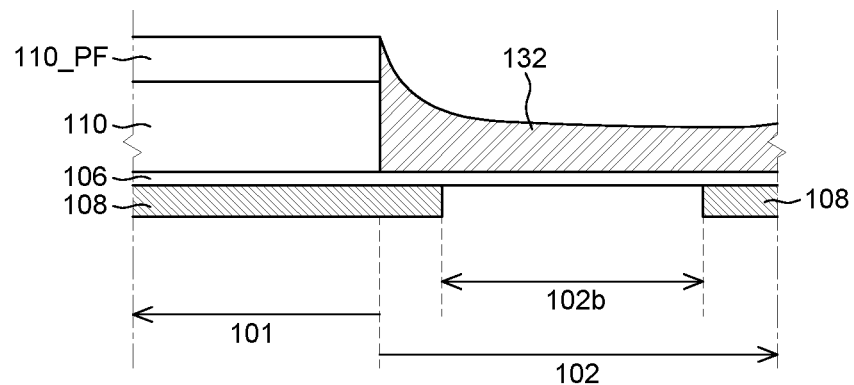
FIGS. 15A to 15C are views illustrating a part of the manufacturing process of the protective coating layer used in the flexible display device according to the present disclosure.
Figure 15B:
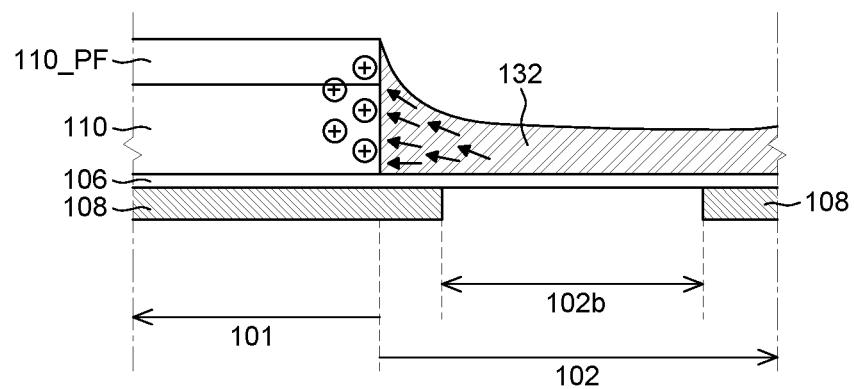
Figure 15C:
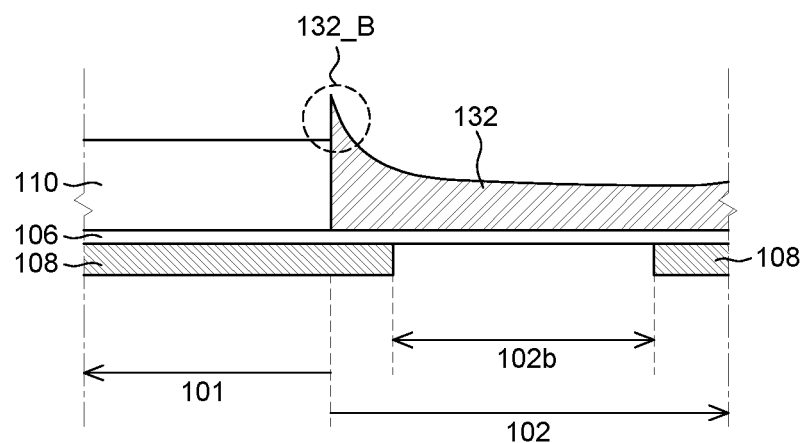

FIGS. 15A to 15C are views illustrating a part of the manufacturing process of the protective coating layer used in the flexible display device.

The protective coating layer 132 as illustrated in FIGS. 13 to 14 has a structure in which a specific resin is applied to the bend portion of the base layer 106. In this structure, when the protective coating layer is in contact with a side of the polarization layer 110, a wetting phenomenon may occur due to surface tension, so that the protective coating layer is coated in a shape that slightly covers the barrier film 104. Such structure may facilitate ensuring the uniformity of the coating surface.

On the other hand, the flexible display device as illustrated in FIGS. 15A to 15C can be implemented with a structure in which the polarization layer 110 is laminated on the base layer 106 (i.e., on the organic light emitting element) without a barrier film. Such a structure is due to the development trend of omitting the barrier film for the use of a highly moisture-resistant (e.g., a water vapor transmission rate (WVTR) of about $1.0 \times 10^{-3}$ to $1.0 \times 10^{-4}$ g/m$^2$ 24 hr) polarization layer, the application of a new encapsulation structure and/or the reduction of thickness.

If the protective coating layer 132 is applied as like the conventional manner to such structure that the barrier film is excluded between the base layer 106 and the polarization layer 110 as illustrated in FIGS. 15A to 15C, then an unevenness thickness (132_A, 132_B) may occur at the side wall of the polarization layer 110 and/or the protective film 110_PF protecting the upper surface of the polarization layer 110 due to the surface tension effect. One of the causes of such unevenness is presumed to be a plasma treatment process. The plasma treatment process is performed on the curved portion so that the coating resin can be spread adequately. As a result of the plasma treatment process, the protective coating layer 132 may spread evenly over the bend portion 102, but the residual charges on the side of the polarization layer 110 as illustrated in FIG. 15B may generate electrostatic force (i.e., static electricity). By this electrostatic force, the coating resin may move toward the polarization layer 110, and the protective coating layer may be formed thicker near the polarization layer than the other portion.

The relatively thicker portion 132_A of the protective coating layer 132 may cause problems such as formation of lumps or irregularities at the bent portion as illustrated in FIG. 14A or 14B. Further, the residual burrs 132_B after removal of the protective film 110_PF may adversely affect the laminating process of a specific layer (e.g., cover glass) on the upper surface of the polarization layer 110. Accordingly, the inventors of the present disclosure have devised a structure in which a protective coating layer can be more effectively applied to a bent portion of a flexible display device.

Figure 16:
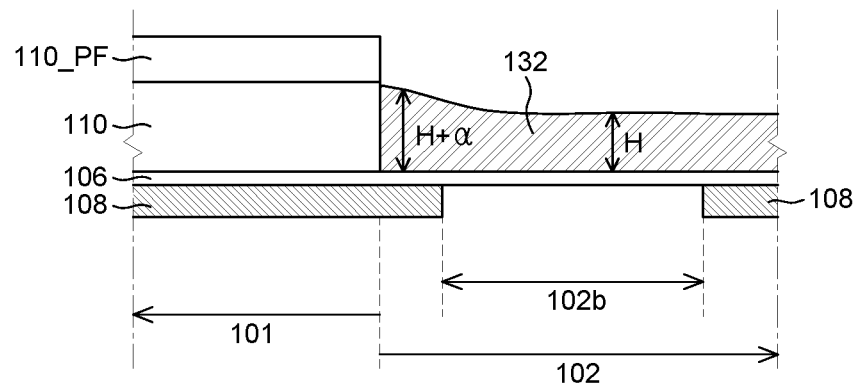
FIG. 16 is a view illustrating a protective coating layer used in a flexible display device according to an embodiment of the present disclosure.

FIG. 16 is a view illustrating a protective coating layer used in a flexible display device according to an embodiment of the present disclosure.

Referring to FIG. 16, the flexible display may include a base layer 106, a polarization layer 110, a protective coating layer 132, a printed circuit board, etc. In some embodiment, the flexible display may further include a support layer 108 and a supporting member (e.g., a mandrel or other element/layer). When the base layer 106 is formed of plastic, the base layer may also be referred to as a plastic film or a plastic substrate. For example, the base layer 106 may be a film type layer including one selected from a group consisting of a polyimide based polymer, a polyester based polymer, a silicon based polymer, an acrylic polymer, a polyolefin based polymer, and a copolymer thereof. Among these materials, polyimide may be applied to a high temperature process and may be coated, thus polyimide is widely used for a plastic substrate.

The base layer 106 of the flexible display may include a first portion 101 and a second portion 102 as illustrated in FIGS. 3A and 4. In FIGS. 3A and 4, it is illustrated that the second portion 102 is extended to the outside of the first portion 101, but the present disclosure is not limited thereto. The first portion 101 is a substantially flat portion on which the organic light emitting element, the polarization layer 110, and the like may be disposed thereon. In this case, the organic light emitting element and the polarization layer 110 are disposed on a first surface (a top surface) of the first portion 101. In the organic light emitting element, the first electrode, the organic light emitting layer, and the second electrode are sequentially disposed. That is, the organic light emitting element may be configured by a first electrode which is electrically connected to the driving thin film transistor (driving TFT), an organic light emitting layer which is disposed on the first electrode, and a second electrode which is disposed on the organic light emitting layer. An encapsulation layer may be disposed on the organic light emitting layer and the polarization layer 110 may be disposed on the organic light emitting element without having the barrier film. An adhesive layer 113 may be disposed on the polarization layer 110 and the cover layer (e.g., cover glass) may be disposed thereon.

On the other hand, the second portion 102, which is the outer portion of the first portion, is a portion which is bent toward a second surface (a bottom surface, which is opposite to the first surface) of the first portion 101. In this case, the second portion 102 may begin (or extend) from the outside of the first portion 101. The second portion 102 may comprise a bend section 102b with a certain curvature and a flat section (i.e., the section supported by the support layer 108) which may not bent.

Figure 17:
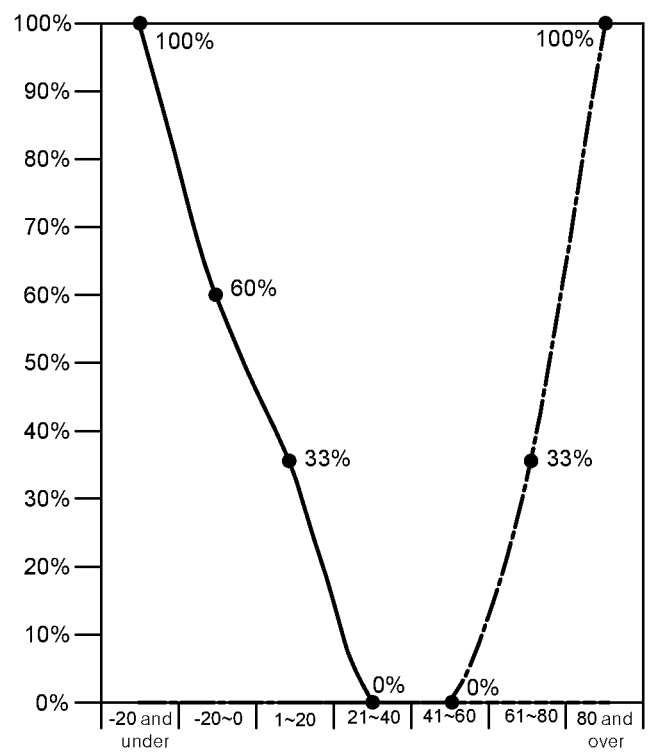
FIG. 17 is a graph illustrating a defective ratio according to the structure of the protective coating layer according to the present disclosure.

The protective coating layer 132 covers at least a portion of the first surface (i.e., top surface) of the second portion 102. The protective coating layer 132 has a structure in which thickness uniformity and adhesion are secured even when applied to a display device having no barrier film on the encapsulation layer. As described above, regarding the flexible display device without the barrier film, it has been necessary to investigate whether the protective coating layer should be coated with any standard so as not to cause problems in bending. Accordingly, the inventors of the present disclosure have determined the optimum coating conditions of protective coating layer by analyzing the force applied to each part of the protective coating layer, the relationship between the thickness of each part and the defect rate. FIG. 17 is the experimental data therefor.

FIG. 17 illustrates the product defect rate according to the difference between the height (H+α) of the portion adjacent to the polarization layer 110 in the protective coating layer 132 and the height H of the substantially flat portion (e.g., the bend section 102b). At this time, the H is 100 μm.

When the height (or thickness) difference is equal to, or less than −20 μm, that is, the height (H+α) of the portion adjacent to the polarization layer 110 is lower than the height H of the substantially flat portion by 20 μm or more, in such case, defects occurred with respect to all products. The defect is a phenomenon such as a curved surface abnormality, insufficient adhesion, resin lump, and the like. Further, when the height difference is between −20 μm to 0 μm, that is, the height (H+α) of the portion adjacent to the polarization layer 110 is lower than the height H of the substantially flat portion by 0 μm to 20 μm, in such case, defect rate was 60% with respect to all products. Accordingly, if the height (H+α) of the portion adjacent to the polarization layer 110 is lower than the height H of the substantially flat portion, the defect rate is analyzed to be very high.

On the other hand, when the height difference is between 0 μm to +20 μm, that is, the height (H+α) of the portion adjacent to the polarization layer 110 is higher than the height H of the substantially flat portion by 0 μm to 20 μm, in such case, defect rate was 33% with respect to all products. Further, when the height difference is between +60 μm to +80 μm, that is, the height (H+α) of the portion adjacent to the polarization layer 110 is higher than the height H of the substantially flat portion by 60 μm to 80 μm, in such case, defect rate was 33% with respect to all products, furthermore, when the height difference is equal to, or greater than +80 μm, in such case, defects occurred with respect to all products.

However, when the height (H+α) of the portion adjacent to the polarization layer 110 is between than the height H of the substantially flat portion by +20 μm to +40 μm, and +40 μm to +50 μm, that is, the height (H+α) of the portion adjacent to the polarization layer 110 is higher than the height H of the substantially flat portion by 20 μm to 40 μm, or 40 μm to 60 μm, in such cases, no defects occurred with respect to all products.

Based on these experimental results, it can be concluded that ① the height (H+α) of the portion adjacent to the polarization layer 110 should be greater than the height H of the substantially flat portion, and ② (When H is 100 μm), the height difference is specifically +20 to +60 μm.

Accordingly, the flexible display device according to the embodiment of the present disclosure may include: a base layer 106 made of a flexible substrate comprising a first portion 101 in which an organic light emitting element is disposed on a first surface; and a second portion (102) outside of the first portion having a bend section (102b) bent toward a second surface opposite to the first surface; and a protective coating layer (132) covering at least a portion of the second portion (102). At this time, the polarization layer 110 is disposed on the organic light emitting element of the first portion without a barrier film, and a portion of the protective coating layer 132 adjacent to the polarization layer 110 is thicker than the other portion. That is, H+α>H.

Here, the portion adjacent to the polarization layer 110 is a portion between the side of the polarization layer 110 and the bend section, and the other portion may be a portion substantially coated with the protective coating layer 132. That is, although it is advantageous in terms of process control that the protective coating layer 132 is applied to all portions at a uniform thickness (H). However, it may reduce the product defects due to the bend when the contact portion of the protective coating layer 132 with the polarization layer 110 is thicker than H.

For example, as illustrated in FIG. 16, a portion adjacent to the polarization layer, that is, a portion to which the protective coating layer 132 is thickly applied, may be part of the upper portion of the support layer 108 between the side of the polarization layer 110 and the bend section. In addition, the other portion, that is, the protective coating layer 132 is uniformly applied at a specific height H may be the other portion including the bending section 102b. At this time, the height (thickness) H may be an average height (thickness) or a maximum height (thickness) of the portion excluding the portion adjacent to the polarization layer. For example, the H may be 100 μm (±5 μm). Further, H+α can be an average height (thickness) or maximum height (thickness) of the adjacent portion.

The thickness (H+α) of the portion to be thicker (the portion adjacent to the polarization layer) may be 20% to 60% greater than the thickness (H) of the portion to be uniformly applied. For example, if the thickness of the protective coating layer 132 applied to the uniformly applied portion (the other portion) is substantially 100 μm, then the thickness of the protective coating layer applied to the portion adjacent to the polarization layer may be 20 μm to 60 μm thicker than the thickness of the protective coating layer applied to the other portion.

On the other hand, the maximum thickness of the protective coating layer 132 may be smaller than the thickness of the polarization layer 110. In order to prevent the polarization layer and the upper layer from being insufficiently bonded due to the occurrence of burrs of the protective coating layer on the side of the polarization layer.

The printed circuit board may be connected to the second portion 102 on the right outside of the protective coating layer 132. Components associated with the operation of the organic light emitting element, such as a driver IC chip, may be mounted on the printed circuit board. Such a printed circuit board can be referred to as COF (chip on film). On the other hand, the driver IC chip may be located in the second portion, and outside of the protective coating layer on the base layer 106. That is, the driver IC chip may be directly formed on the base layer 106. A conductive line connecting the driver IC chip and the organic light emitting element may be disposed in the second portion, and the protective coating layer may cover the conductive line.

FIGS. 18A to 18E are views illustrating a process of applying a protective coating layer to a flexible display device according to an embodiment of the present disclosure.

Referring to FIGS. 18A to 18E, the flexible display device may include a base layer 106, a polarization layer 110, a protective coating layer 132, an adhesive layer 113, a cover layer 114, a printed circuit board 134, and the like. If necessary, the flexible display device may further include a support layer 108, a support member 116, and the like. When the base layer 106 is made of plastic, it may be referred to as a plastic film or a plastic substrate. For example, the base layer 106 may be a film type layer including one selected from a group consisting of a polyimide based polymer, a polyester based polymer, a silicon based polymer, an acrylic polymer, a polyolefin based polymer, and a copolymer thereof. Among these materials, polyimide may be applied to a high temperature process and may be coated, thus polyimide is widely used for a plastic substrate.

The base layer 106 of the flexible display may include a first portion 101 and a second portion 102 as illustrated in FIGS. 3A and 4. In FIGS. 3A and 4, it is illustrated that the second portion 102 is extended to the outside of the first portion 101, but the present disclosure is not limited thereto. The first portion 101 is a substantially flat portion on which the organic light emitting element, the polarization layer 110, and the like may be disposed thereon. In this case, at least a part or all of the organic light emitting element and the polarization layer 110 are disposed on a first surface (a top surface) of the first portion 101. In the organic light emitting element, the first electrode, the organic light emitting layer, and the second electrode are sequentially disposed. That is, the organic light emitting element may be configured by a first electrode which is electrically connected to the driving thin film transistor (driving TFT), an organic light emitting layer which is disposed on the first electrode, and a second electrode which is disposed on the organic light emitting layer. An encapsulation layer may be disposed on the organic light emitting layer and the polarization layer 110 may be disposed on the organic light emitting element without having the barrier film. An adhesive layer 113 may be disposed on the polarization layer 110 and the cover layer (e.g., cover glass) may be disposed thereon.

On the other hand, the second portion 102, which is the outer portion of the first portion, is a portion which is bent toward a second surface (a bottom surface, which is opposite to the first surface) of the first portion 101. In this case, the second portion 102 may begin (or extend) from the outside of the first portion 101. The second portion 102 may comprise a bend section 102b with a certain curvature and a flat section (i.e., the section supported by the support layer 108) which may not bent.

The protective coating layer 132 covers at least a portion of the first surface (i.e., top surface) of the second portion 102. The protective coating layer 132 has a structure in which thickness uniformity and adhesion are secured even when applied to a display device having no barrier film on the encapsulation layer. As described above, regarding the flexible display device without the barrier film, it has been necessary to investigate whether the protective coating layer should be coated with any standard so as not to cause problems in bending. Accordingly, the inventors of the present disclosure analyzed the force applied to each part of the protective coating layer, the relationship between the thickness of each part and the defect rate, and recognized that ① the portion of the protective coating layer adjacent to the polarization layer 110 should be thicker than the other portion (substantially flat portion), and ② if not, a large amount of defective products will occur due to bending.

In order to make the thickness of the protective coating layer uniform while satisfying the above conditions, the protective coating layer 132 may be partially overflowed above the polarization layer 110 as illustrated in FIGS. 18A to 18E. That is, a part of the top surface adjacent to the edge of the polarization layer 110 may be covered with the protective coating layer 132. The region of the polarization layer 110 that is in contact with the surface of the polarization layer 110 suppresses the protective coating layer 132 being departed from the polarization layer 110 due to bending stress. The improved sealing at the edges of the polarization layer 110 provided by the protective coating layer 132 may reduce corrosion of the conductive lines in the bend section. Similarly, the protective coating layer 132 may be overflowed on at least a part of the printed circuit board 134 to improve edge sealing of the printed circuit board 134.

Accordingly, the flexible display device according to the embodiment of the present disclosure may include: a base layer 106 made of a flexible substrate comprising a first portion 101 in which an organic light emitting element is disposed on a first surface; and a second portion (102) outside of the first portion having a bend section (102*b*) bent toward a second surface opposite to the first surface; and a protective coating layer (132) covering at least a part of the second portion (102). At this time, the polarization layer 110 is disposed on the organic light emitting element of the first portion without a barrier film, and the protective coating layer 132 covers a part of the top surface adjacent to the edge of the polarization layer 110. The width of the protective coating layer 132 covering the top surface adjacent to the edge of the polarization layer 110 may be 0.2 mm to 1 mm. On the other hand, the polarization layer 110 may have a higher degree of moisture-resistance ability than a polarization layer included in a flexible display device having a barrier film on the organic light-emitting device.

A flexible display device according to an embodiment of the present disclosure may be manufactured through the following process so as to have the above-described structure. First, an organic light emitting element is arranged on the first portion 101 of the flexible substrate 106, and an encapsulation layer is formed on the organic light emitting element.

Figure 18A:
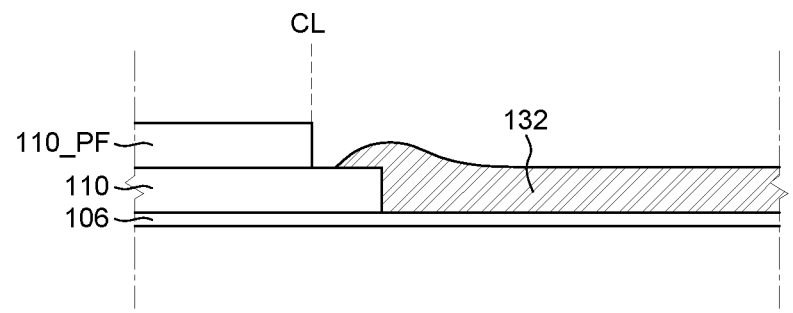
FIGS. 18A to 18E are views illustrating a process of applying a protective coating layer to a flexible display device according to an embodiment of the present disclosure.

Then, as illustrated in FIG. 18A, a part of the edge (corner) of the protective film 110_PF is removed along the cutting line CL. The protective film 110_PF is attached to the polarization layer from the beginning for protection during movement/storage process.

At this time, the length (width) of the part to be removed (cut off) in the protective film 110_PF may be optimally determined by taking into account the adhesive force of the protective coating layer, the degree of contamination of the polarization layer to be exposed, (e.g., 0.2 to 1 mm). Further, the length of the part to be removed may be determined in consideration of the properties of the structure (e.g., adhesive layer, touch layer, cover layer, and the like) stacked on the polarization layer 110. At this time, the removal of a part of the protective film should be performed after the polarization layer 110 is stacked on the base layer 106 in terms of contamination prevention, rather than being performed before the polarization layer 110 is laminated on the base layer 106. The removal process of a part of the protective film 110_PF may be performed through various known processes and/or equipment.

The printed circuit board 134 can be attached to the outside of the second portion 102 of the flexible substrate 106 before or after the removal of a part of the protective film 110_PF.

After the removal of a part of the protective film 110_PF or after the attachment of the printed circuit board 134, the protective coating layer 132 is applied on at least a portion of the curved portion (the second portion, the outside of the first portion. In particular, between the polarization layer 110 and the printed circuit board 134). At this time, the protective coating layer 132 may be applied to at least a part of the removed portion of the protective film (the upper surface adjacent to the edge of the exposed polarization layer). If a protective coating layer 132 is applied to the entire surface of the removed portion of the protective film, the width may be about 0.2 mm to 1 mm.

Except the portion covering the top surface adjacent to the edge of the polarization layer, the thickness of the protective coating layer 132 applied to the curved portion (particularly the bend section) may be substantially the same as the thickness of the polarization layer 110 (the thickness from the base layer 106 to the upper surface of the polarization layer 110). The protective coating layer 132 may be partially overflowed to the top surface of the polarization layer 110 as illustrated. That is, a part of the top surfaces adjacent to the edge of the polarization layer 110 may be covered with the protective coating layer 132.

Figure 18B:
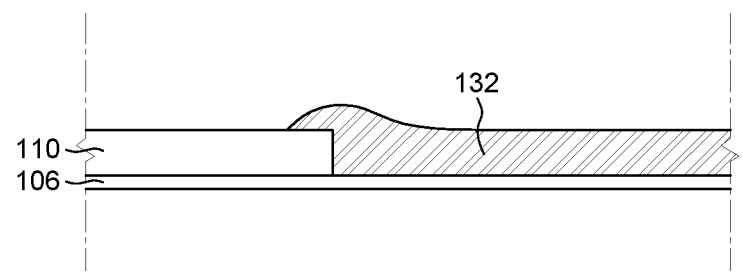

Next, as illustrated in FIG. 18B, the protective film is separated from the upper part of the polarization layer. Here, the process of removing the protective film 110_PF on the polarization layer 110 can be performed through various known processes and/or equipment.

Figure 18C:
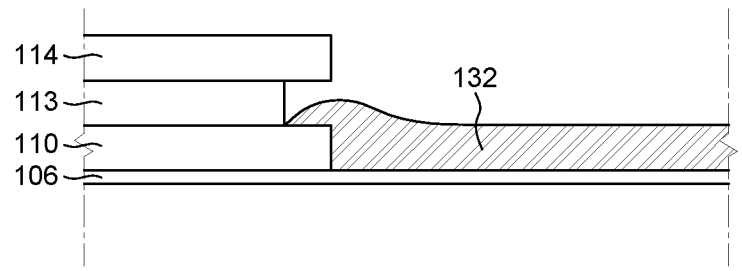

As illustrated in FIG. 18C, one or more functional layers are formed on the polarization layer 110. The adhesive layer 113 and the cover layer 114 may be stacked on the polarization layer 110 as illustrated, but the present disclosure is not limited thereto. For example, a touch layer or the like may be further stacked on the polarization layer 110. The adhesive layer 113 may be a film-type transparent adhesive such as OCA (optical clear adhesive).

Figure 18D:
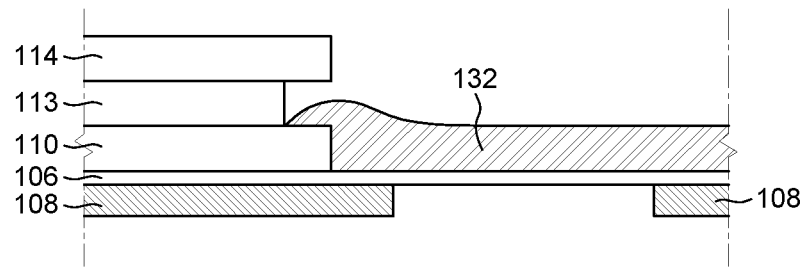

As illustrated in FIG. 18D, one or more functional layers are stacked on the bottom of the base layer 106. The support layer 108 may be stacked below the base layer 106 as illustrated, but the present disclosure is not limited thereto. For example, a support member (e.g., a mandrel) or the like may be further disposed under the support layer 108.

Figure 18E:
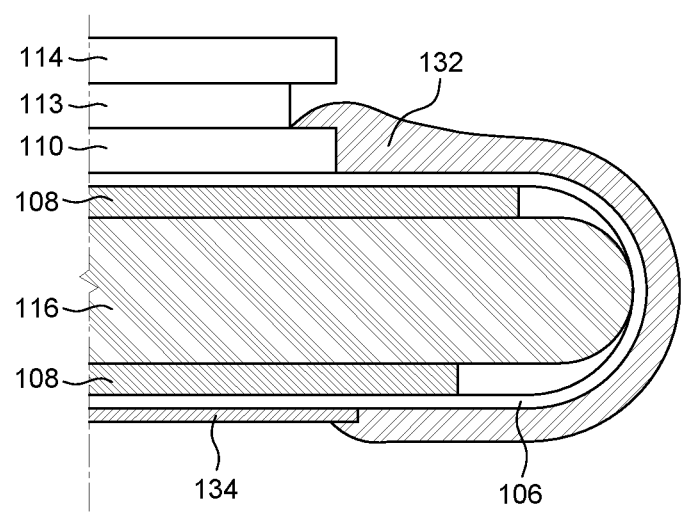

After the necessary functional layers are stacked, the outer portion (edge) of the flexible display device is bent such that the second portion 102 faces the opposite surface of the surface on which the organic light emitting elements are arranged as illustrated in FIG. 18E. The curvature to be bent may vary from product to product, and support member 116 may be used for ease of bend.

The printed circuit board 134 may be connected to the outside of the base layer 106. Components associated with the operation of the organic light emitting element, such as a driver IC chip, may be mounted on the printed circuit board 134. Such a printed circuit board can be referred to as COF (chip on film). On the other hand, the driver IC chip may be located on the outer base layer 106 of the protective coating layer in the second portion. That is, the driver IC chip may be directly formed on the base layer 106. A conductive line connecting the driver IC chip and the organic light emitting element is disposed in the second portion 102, and the protective coating layer 132 covers the conductive line.

The exemplary embodiments of the present disclosure can also be described as follows.

According to an aspect of the present disclosure, a flexible display device may include a first portion in which an organic light emitting element is disposed on a first surface; a base layer made of a flexible substrate including a second portion, outside of the first portion, having a bend section bent toward a second surface opposite to the first surface; and a protective coating layer covering at least a part of the second portion, wherein a polarization layer is on the organic light emitting element of the first portion without a barrier film, and wherein the protective coating layer is coated such that a portion adjacent to the polarization layer is thicker than the other portion.

The polarization layer may have a higher moisture-resistance ability than a polarization layer included in a flexible display device with a barrier film on an organic light-emitting element.

The polarization layer may have a moisture-resistant of a water vapor transmission rate (WVTR) of about $1.0 \times 10^{-3}$ to $1.0 \times 10^{-4}$ g/m$^2$24 hr.

The portion adjacent to the polarization layer may be a portion between a side of the polarization layer and the bend section, and the other portion may be a portion where the protective coating layer is applied substantially flat.

The portion adjacent to the polarization layer may be a part of an upper portion of a support layer attached to the second surface of the base layer, and the other portion may be an upper portion of the bend section.

A thickness of the protective coating layer of the portion adjacent to the polarization layer may be 20% to 60% greater than a thickness of the protective coating layer applied to the other portion.

The thickness of the protective coating layer applied to the other portion may be substantially 100 μm, and the thickness of the protective coating layer applied to the portion adjacent to the polarization layer may be 20 μm to 60 μm thicker than the thickness of the protective coating layer applied to the other portion.

The maximum thickness of the protective coating layer may be smaller than the thickness of the polarization layer.

A driver IC chip may be located outside of the protective coating layer in the second portion.

A conductive line connecting the driver IC chip and the organic light emitting element may be in the second portion, and the protective coating layer may cover the conductive line.

According to another aspect of the present disclosure, a flexible display device may include a first portion in which an organic light emitting element is disposed on a first surface; a base layer made of a flexible substrate including a second portion, outside of the first portion, having a bend section bent toward a second surface opposite to the first surface; and a protective coating layer covering at least a part of the second portion, wherein a polarization layer is on the organic light emitting element of the first portion without a barrier film, and wherein the protective coating layer covers a part of a top surface adjacent to an edge of the polarization layer.

The polarization layer may have a higher moisture-resistance ability than a polarization layer included in a flexible display device with a barrier film on an organic light-emitting element.

A width of the protective coating layer covering the top surface adjacent to the edge of the polarization layer may be 0.2 mm to 1 mm.

A thickness of the protective coating layer applied to the bend section may be substantially the same as a thickness of the polarization layer.

A printed circuit board may be connected in the second portion outside of the protective coating layer, and a driver IC chip may be mounted on the printed circuit board.

According to another aspect of the present disclosure, a method of manufacturing a flexible display device may comprise arranging an organic light emitting element on a first portion of a flexible substrate, and stacking an encapsulation layer on the organic light emitting element; stacking a polarization layer on the encapsulation layer without a barrier film; removing a part of an edge of a protective film covering an upper surface of the polarization layer; and applying a protective coating layer to at least a part of the upper surface of the polarization layer exposed by the removing step and at least a portion of a second portion outside of the first portion.

The method may further comprise bending the second portion toward an opposite surface of a surface on which the organic light emitting element is arranged.

Removing the part of the edge of a protective film may be removing an outer portion of the protective film by a width determined by considering an adhesive strength of the protective coating layer and a degree of contamination of the polarization layer.

The removed width may be 0.2 mm to 1 mm.

The method may further comprise attaching a printed circuit board to an outside of the second portion of the flexible substrate Applying the protective coating layer may be applying the protective coating layer between the polarization layer and the printed circuit board.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical scope of the present disclosure. The scope of the technical features of the present disclosure is not limited thereto. The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other. The protective scope of the present disclosure should be construed based on the following claims, and all the technical concepts in the equivalent scope thereof should be construed as falling within the scope of the present disclosure.

What is claimed is:

1. A flexible display device, comprising:
a base layer made of a flexible substrate, the base layer having a first surface and a second surface opposite to the first surface;
a first portion of the base layer in which an organic light emitting element is disposed on the first surface;
a second portion of the base layer outside of the first portion, the second portion having a bend section which is bent toward the second surface opposite to the first surface;
a protective coating layer covering at least a part of the second portion;
a polarization layer on the organic light emitting element of the first portion without a barrier film between the polarization layer and the organic light emitting element; and
a supporting layer disposed on the base layer,
wherein the protective coating layer is coated such that a portion of the protective coating layer adjacent to the polarization layer is thicker than another portion of the protective coating layer,
wherein a difference between a thickness of the portion of the protective coating layer adjacent to the polarization layer and a thickness of the another portion of the protective coating layer is between about 20% to about 60% of the thickness of the another portion of the protective coating layer, wherein a maximum thickness of the polarization layer is greater than a maximum thickness of the protective coating layer, and wherein the base layer is disposed between the supporting layer and the polarization layer, and the supporting layer includes a first supporting portion and a second supporting portion spaced apart from the first supporting portion, and the first and second supporting portions being located on opposite sides of the bend section.

2. The flexible display device according to claim 1, wherein the polarization layer has a higher moisture-resistance ability than another polarization layer included in a flexible display device having a barrier film on an organic light-emitting element.

3. The flexible display device according to claim 2, wherein the polarization layer has a water vapor transmission rate (WVTR) of about $1.0 \times 10^{-3}$ to $1.0 \times 10^{-4}$ g/m$^2$24 hr.

4. The flexible display device according to claim 1, wherein the portion adjacent to the polarization layer is a portion between a side of the polarization layer and the bend section, and wherein the another portion is a portion where the protective coating layer is applied flat.

5. The flexible display device according to claim 4, wherein the portion adjacent to the polarization layer is overlapping a part of an upper portion of a support layer attached to the second surface of the base layer with a portion of the base layer therebetween, and wherein the another portion is an upper portion of the bend section.

6. The flexible display device according to claim 4, wherein a thickness of the protective coating layer at the portion adjacent to the polarization layer is 20% to 60% greater than a thickness of the protective coating layer at the another portion.

7. The flexible display device according to claim 4, wherein the thickness of the protective coating layer at the another portion is substantially 100 μm, and wherein the thickness of the protective coating layer at the portion adjacent to the polarization layer is 20 μm to 60 μm thicker than the thickness of the protective coating layer applied to the another portion.

8. The flexible display device according to claim 1, wherein the maximum thickness of the protective coating layer is smaller than the thickness of the polarization layer.

9. The flexible display device according to claim 1, wherein a conductive line is disposed in the second portion, and wherein the protective coating layer covers the conductive line.

10. The flexible display device according to claim 1, wherein the base layer directly contacts the protective coating layer, and the first and second supporting portions of the supporting layer.

11. A flexible display device, comprising:

a base layer made of a flexible substrate, the base layer having a first surface and a second surface opposite to the first surface;

a first portion of the base layer in which an organic light emitting element is disposed on the first surface;

a second portion of the base layer outside of the first portion, the second portion having a bend section which is bent toward the second surface opposite to the first surface;

a protective coating layer covering at least a part of the second portion;

a polarization layer on the organic light emitting element of the first portion without a barrier film between the polarization layer and the organic light emitting element; and a supporting layer disposed on the base layer, wherein the protective coating layer covers a part of a top surface of the base layer adjacent to an edge of the polarization layer, wherein a difference between a thickness of the portion of the protective coating layer adjacent to the polarization layer and a thickness of the another portion of the protective coating layer is between about 20% to about 60% of the thickness of the another portion of the protective coating layer, wherein a maximum thickness of the polarization layer is greater than a maximum thickness of the protective coating layer, and wherein the base layer is disposed between the supporting layer and the polarization layer, and the supporting layer includes a first supporting portion and a second supporting portion spaced apart from the first supporting portion, and the first and second supporting portions being located on opposite sides of the bend section.

12. The flexible display device according to claim 11, wherein the polarization layer has a higher moisture-resistance ability than another polarization layer included in a flexible display device having a barrier film on an organic light-emitting element.

13. The flexible display device according to claim 11, wherein a width of the protective coating layer covering the top surface adjacent to the edge of the polarization layer is 0.2 mm to 1 mm.

14. The flexible display device of claim 11, wherein a printed circuit board is connected in the second portion outside of the protective coating layer.

15. The flexible display device according to claim 11, wherein the base layer directly contacts the protective coating layer, and the first and second supporting portions of the supporting layer.

* * * * *